(12) United States Patent
Lu et al.

(10) Patent No.: US 12,707,668 B2
(45) Date of Patent: Aug. 11, 2026

(54) PLANAR MOSFET WITH LIGHT, REGULAR AND HEAVILY DOPED REGIONS

(71) Applicant: Invention And Collaboration Laboratory Pte. Ltd., Singapore (SG)

(72) Inventors: Chao-Chun Lu, Hsinchu (TW); Li-Ping Huang, Hsinchu (TW)

(73) Assignee: INVENTION AND COLLABORATION LABORATORY PTE. LTD., Singapore (SG)

( * ) Notice: Subject to any disclaimer, the term of this patent is extended or adjusted under 35 U.S.C. 154(b) by 439 days.

(21) Appl. No.: 18/219,435

(22) Filed: Jul. 7, 2023

(65) Prior Publication Data

US 2024/0014319 A1 Jan. 11, 2024

Related U.S. Application Data

(60) Provisional application No. 63/359,231, filed on Jul. 8, 2022.

(51) Int. Cl.
*H10D 30/60* (2025.01)
*H10D 62/10* (2025.01)
*H10D 84/84* (2025.01)

(52) U.S. Cl.
CPC ......... *H10D 30/601* (2025.01); *H10D 62/116* (2025.01); *H10D 84/84* (2025.01)

(58) Field of Classification Search
CPC ............................ H10D 30/601; H10D 84/84
USPC .......................................................... 257/408
See application file for complete search history.

(56) References Cited

U.S. PATENT DOCUMENTS 8,106,466 B2 * 1/2012 Cheng .................. H10D 64/021 257/65
2008/0099852 A1 * 5/2008 Faul .................. H10D 30/0227 257/E21.336
2015/0145072 A1 * 5/2015 Faul .................. H10D 30/0227 257/E21.336
2015/0155382 A1 * 6/2015 Hung .................. H10D 62/834 257/408
2017/0365715 A1 * 12/2017 Nandakumar ..... H10D 84/0167
2021/0351272 A1 * 11/2021 Kim .................... H10D 62/822 257/408

FOREIGN PATENT DOCUMENTS

TW 202143384 A 11/2021

OTHER PUBLICATIONS

Taiwanese Office Action and Search Report for Taiwanese Application No. 112125250, dated May 31, 2024.

* cited by examiner

*Primary Examiner* — Ratisha Mehta
*Assistant Examiner* — Timothy Edward Duren
(74) *Attorney, Agent, or Firm* — Birch, Stewart, Kolasch & Birch, LLP

(57) ABSTRACT

A transistor structure includes a semiconductor substrate, a gate region, a first trench, a first isolation region and a first conductive region. The semiconductor substrate is with an original semiconductor surface. The gate region is over the semiconductor surface. The first trench is formed below the original semiconductor surface. The first isolation region is in the first trench. The first conductive region is formed with a first doping region and a second doping region; wherein the first doping region is within the semiconductor substrate and the second doping region is formed outside from the semiconductor substrate.

13 Claims, 17 Drawing Sheets

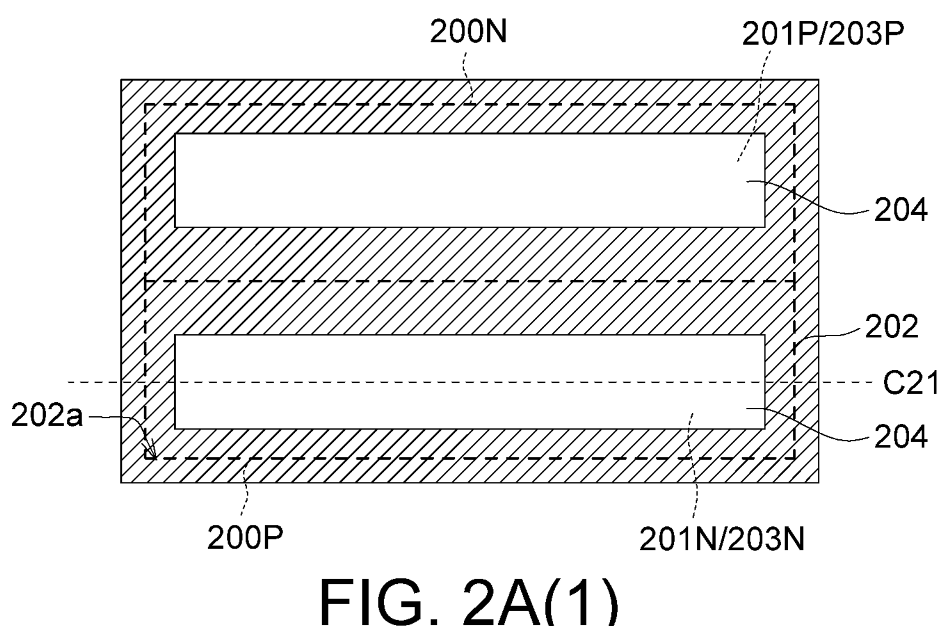
FIG. 2A(1)
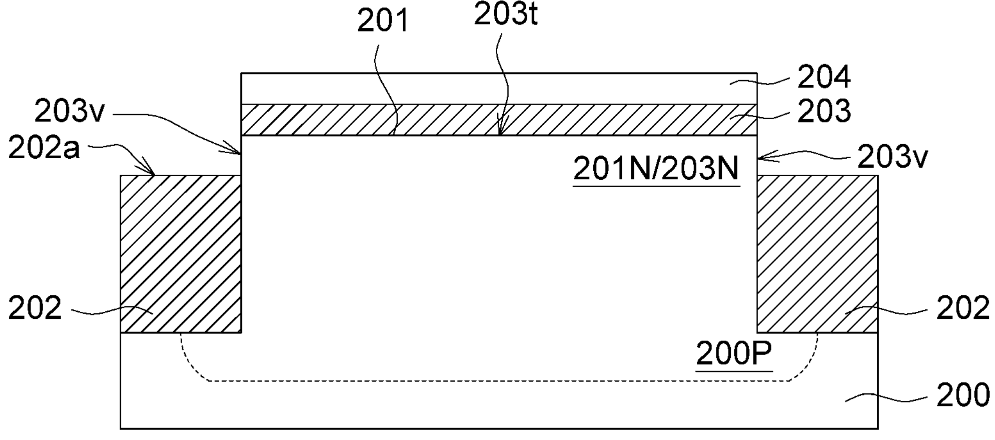
FIG. 2A(2)

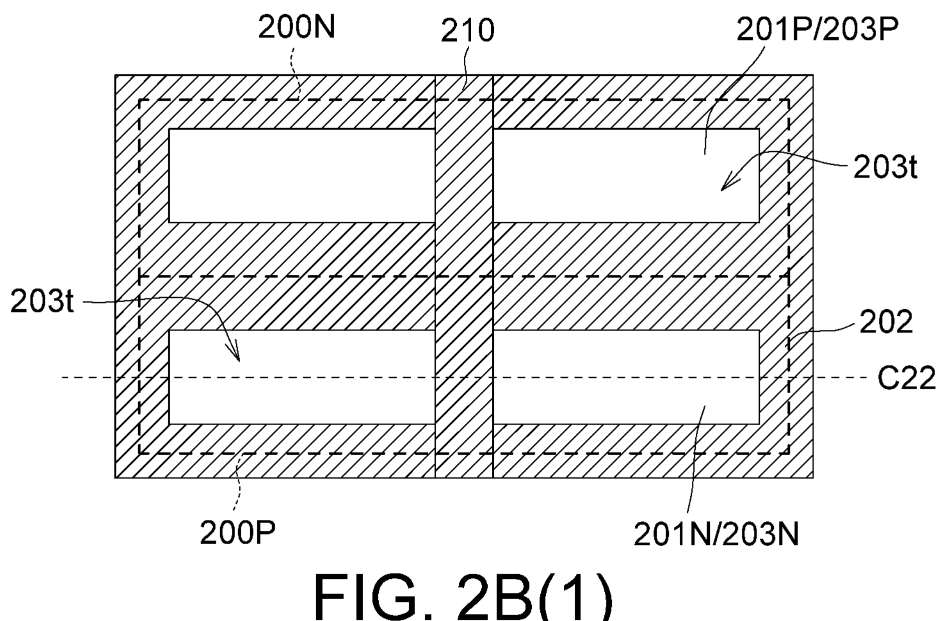
FIG. 2B(1)
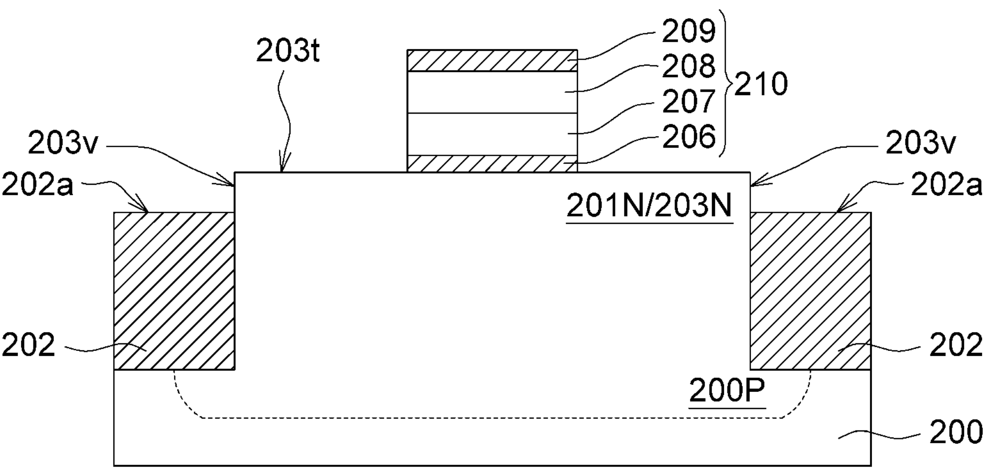
FIG. 2B(2)

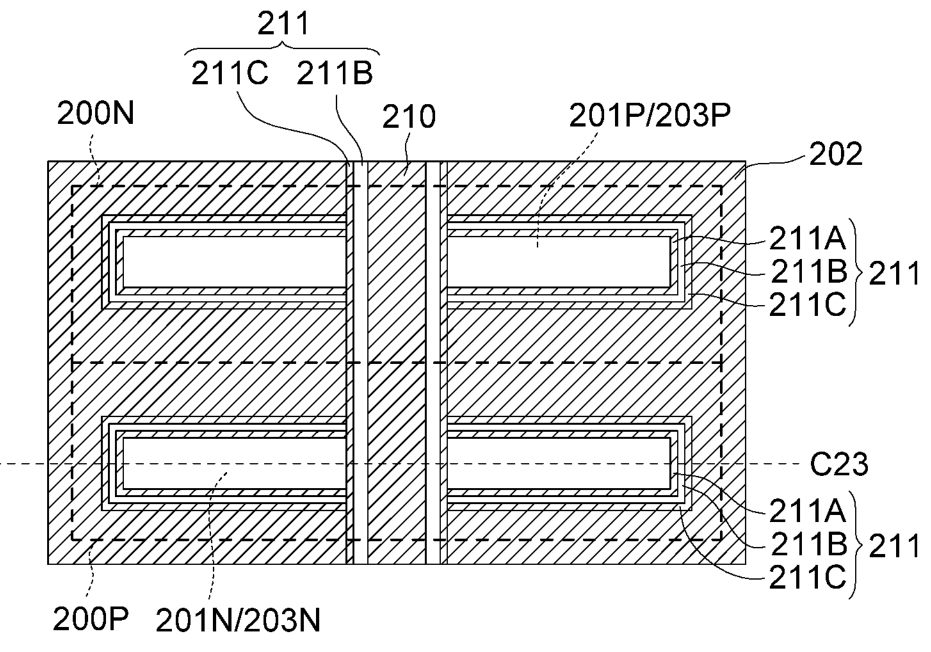
FIG. 2C(1)
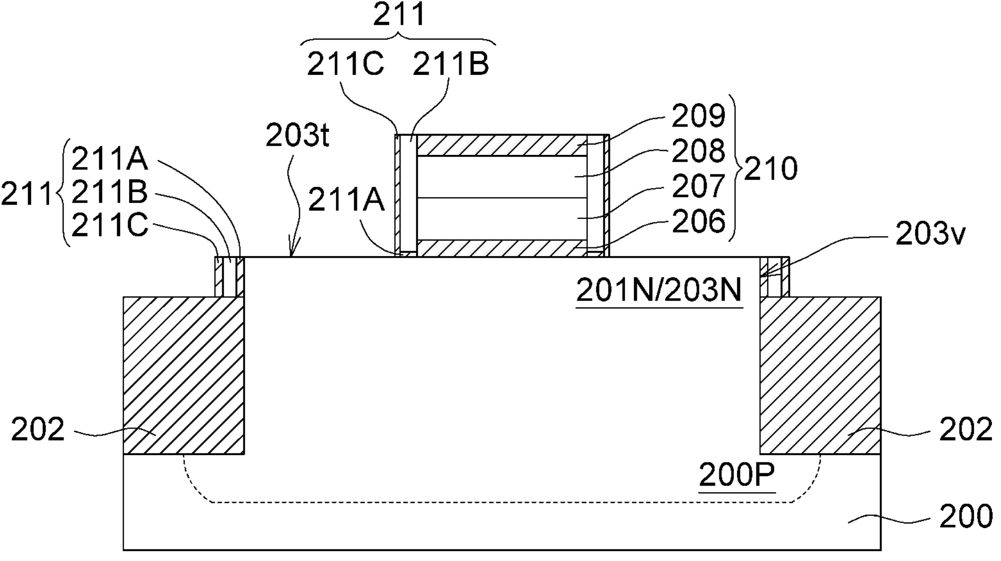
FIG. 2C(2)

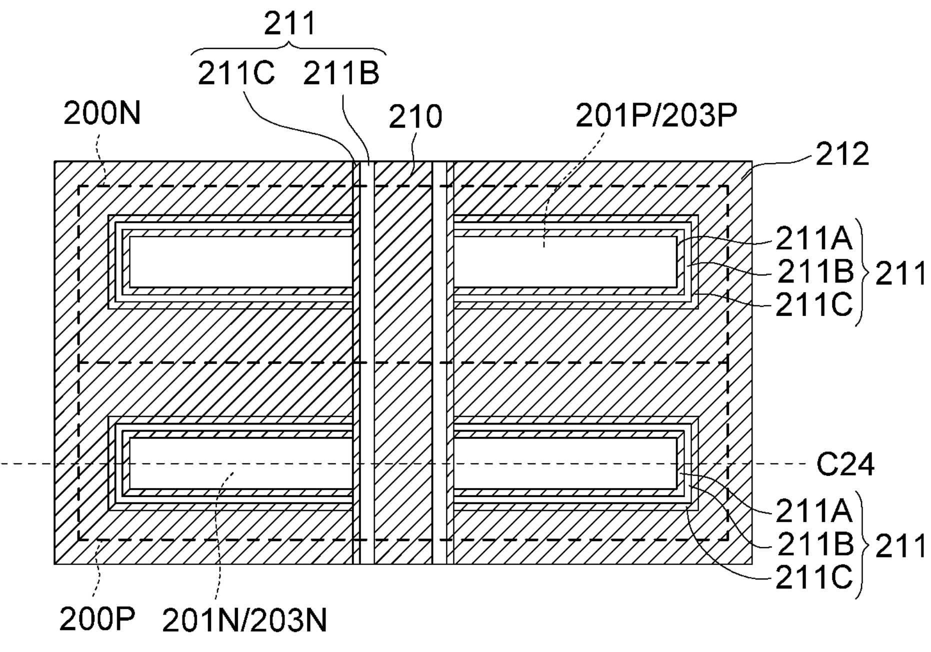
FIG. 2D(1)
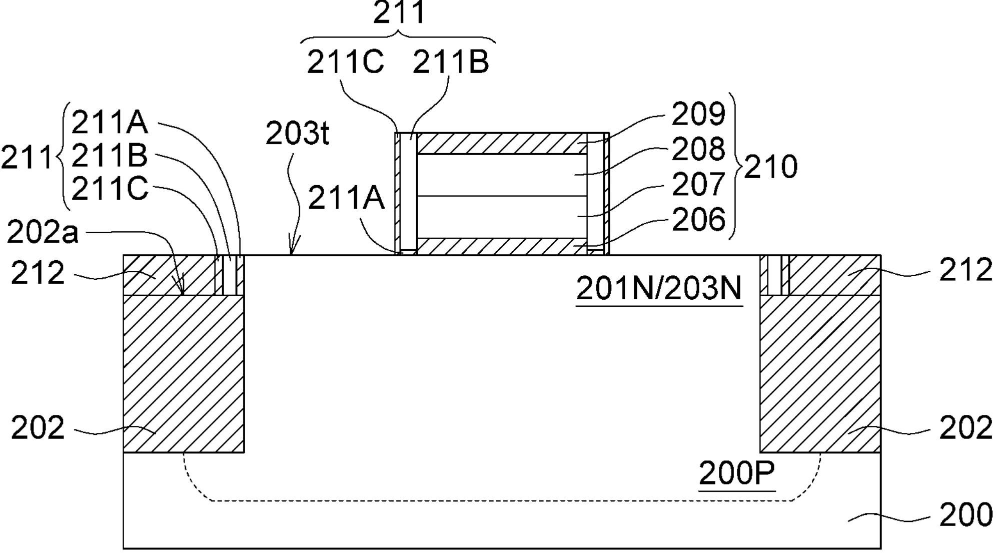
FIG. 2D(2)

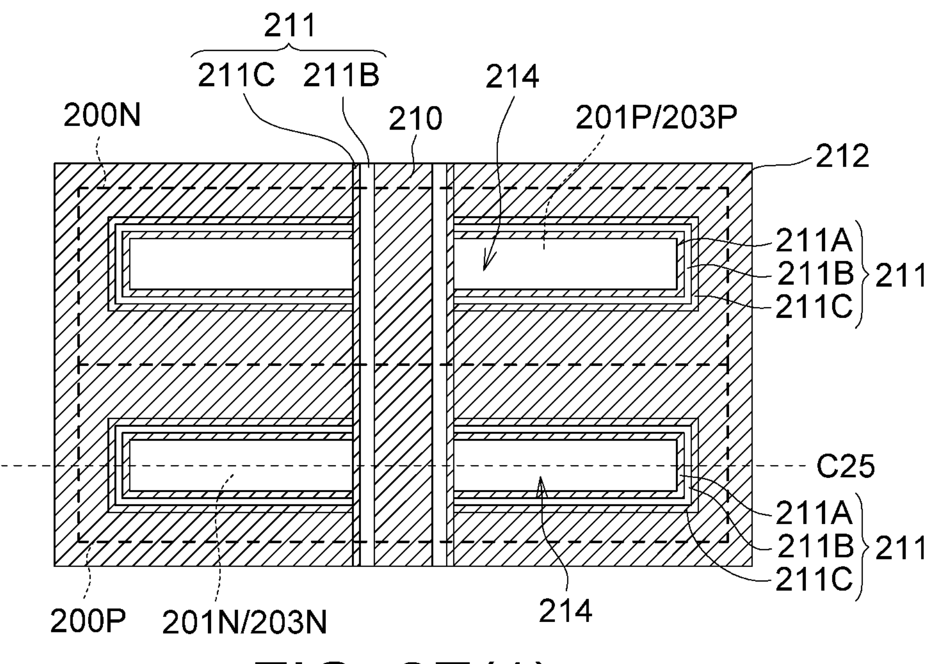
FIG. 2E(1)
211
211C 211B
211A
211B
211C
211
203t
211A
214
209
208
207
206
210
202a
212
214
202a
212
214b
203N
202
202
200P
200
FIG. 2E(2)

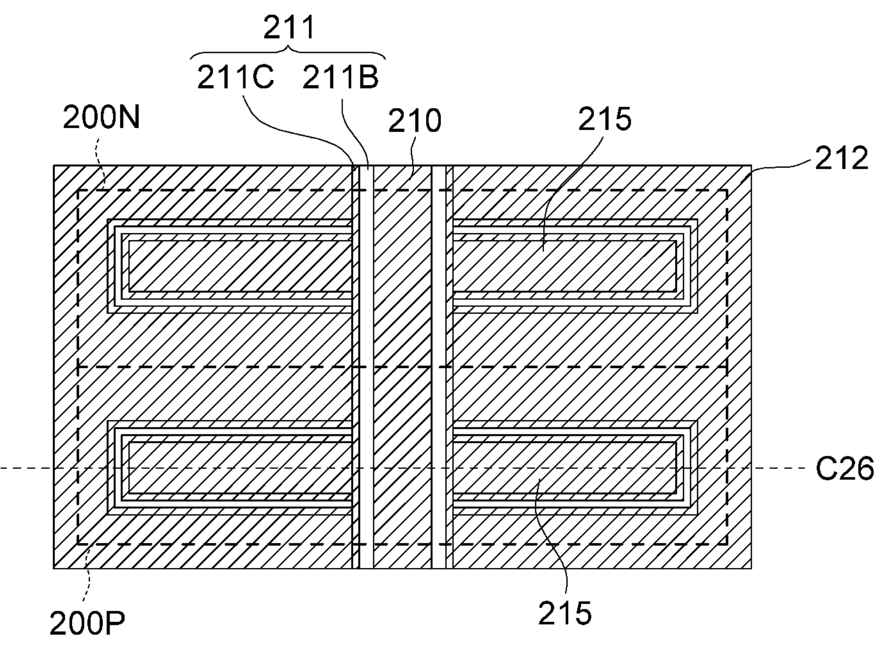
FIG. 2F(1)
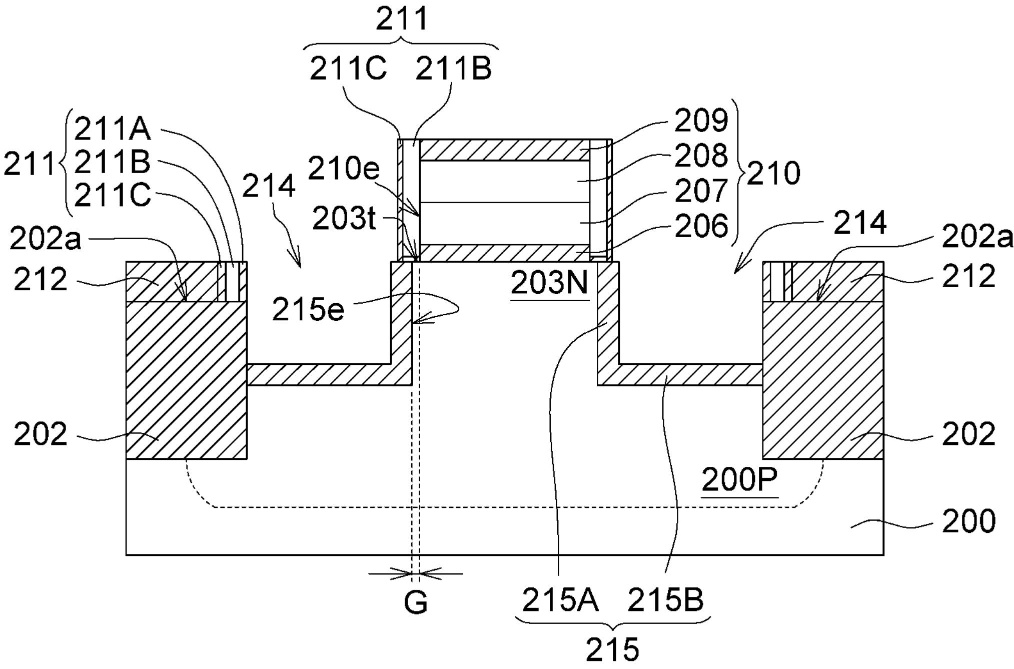
FIG. 2F(2)

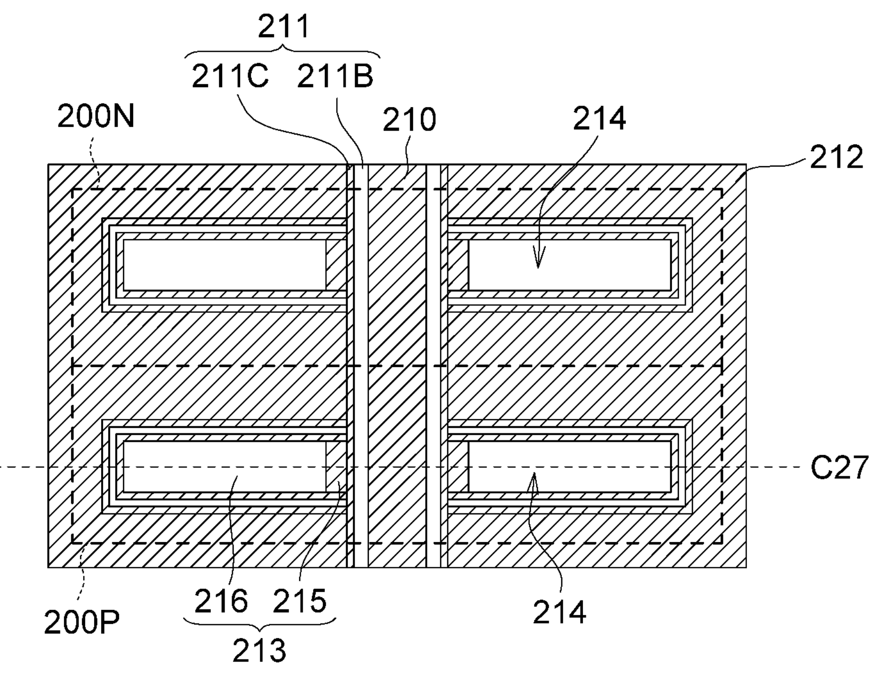
FIG. 2G(1)
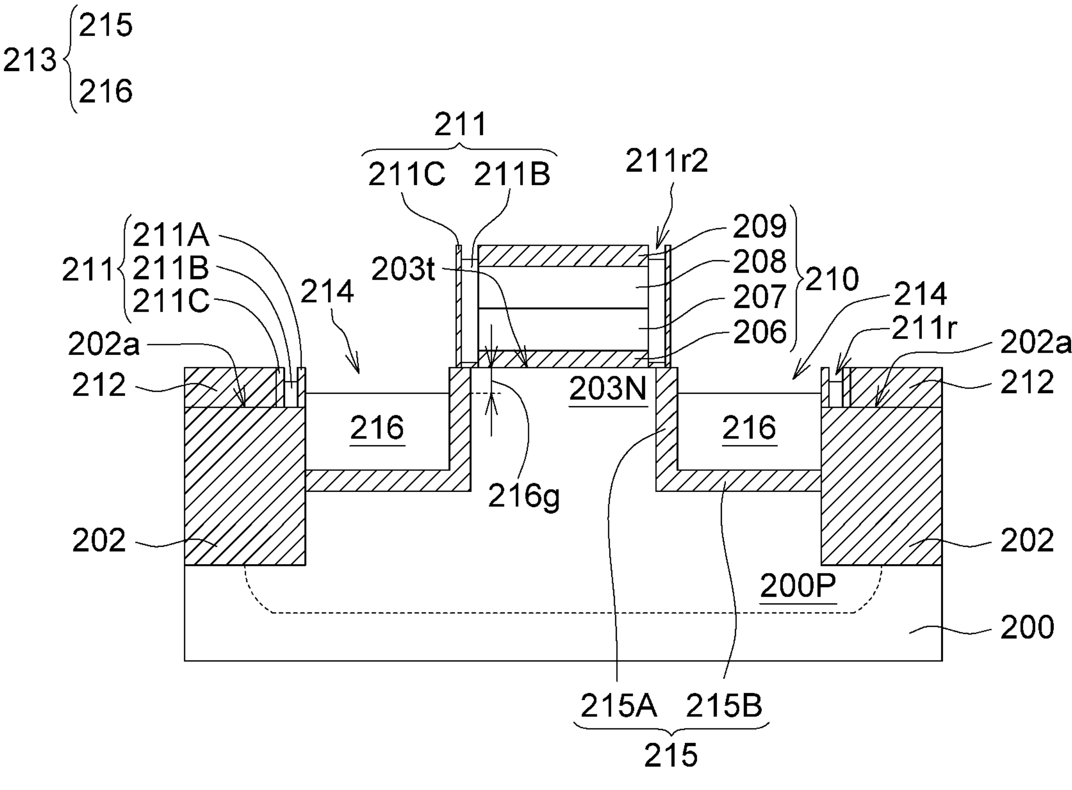
FIG. 2G(2)

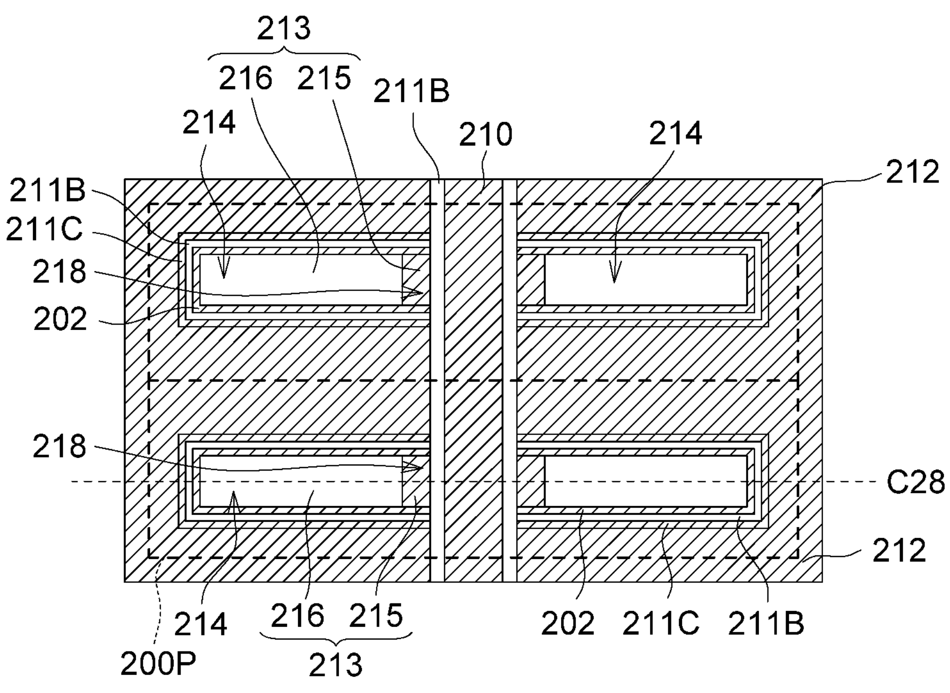
FIG. 2H(1)
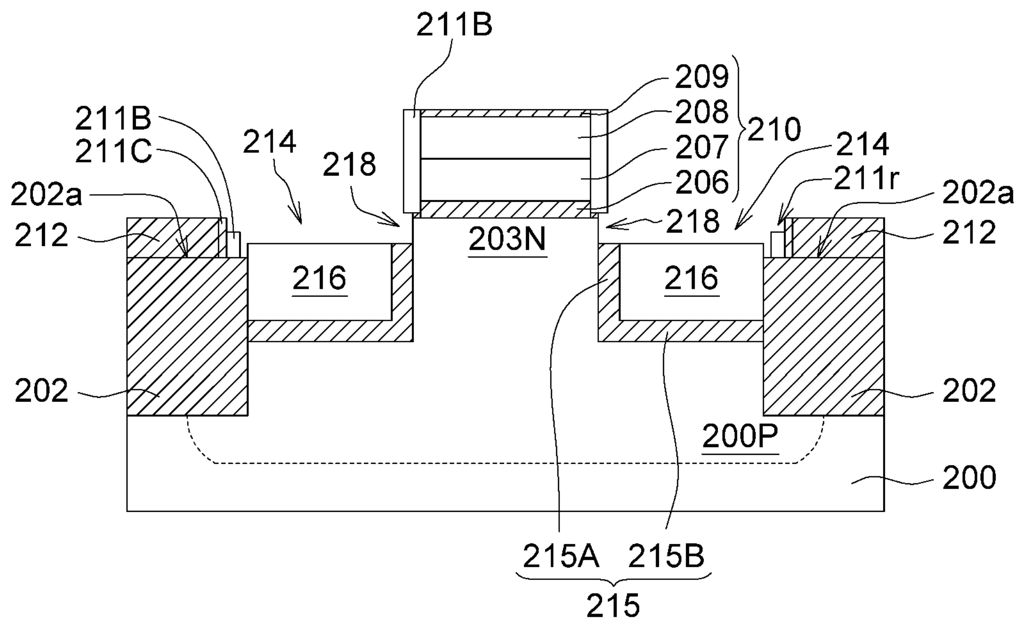
FIG. 2H(2)

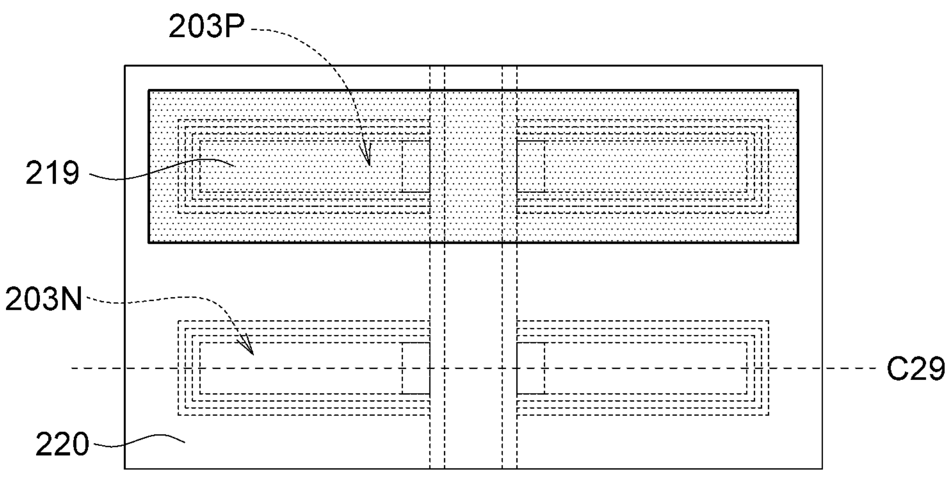
FIG. 2I(1)
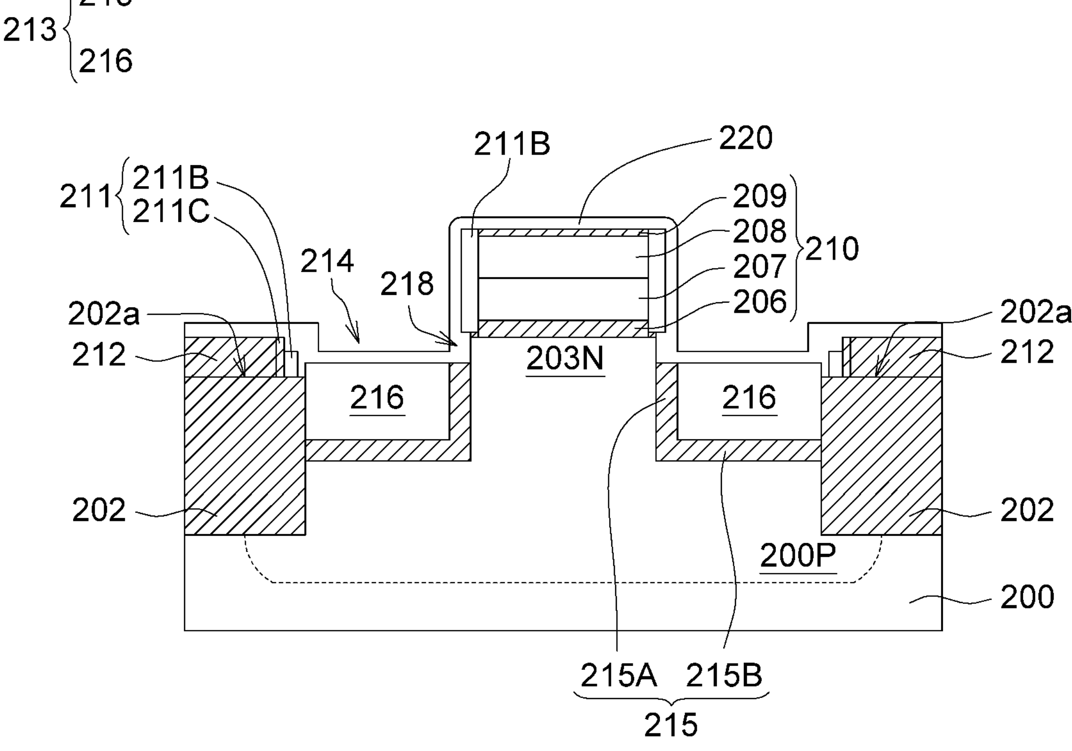
FIG. 2I(2)

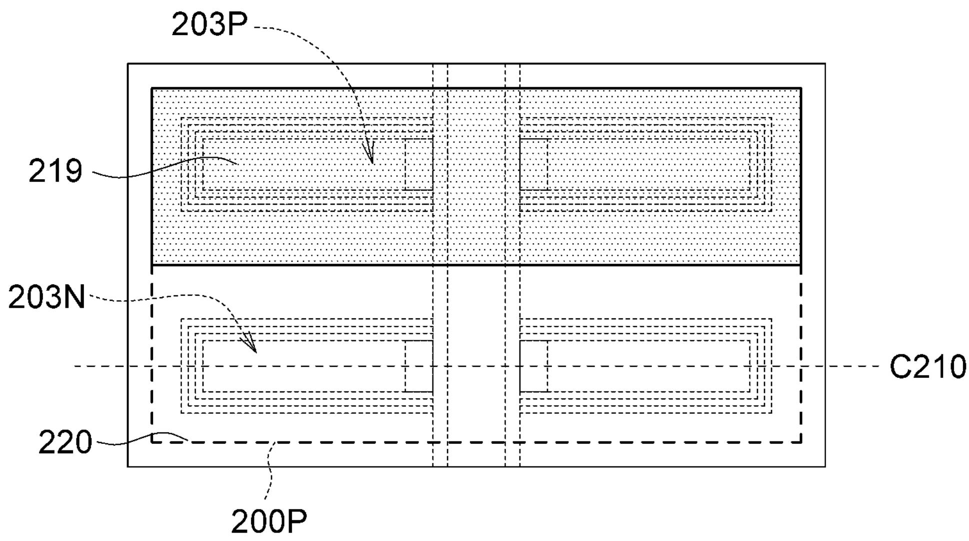
FIG. 2J(1)
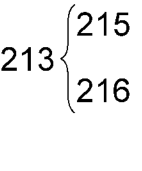
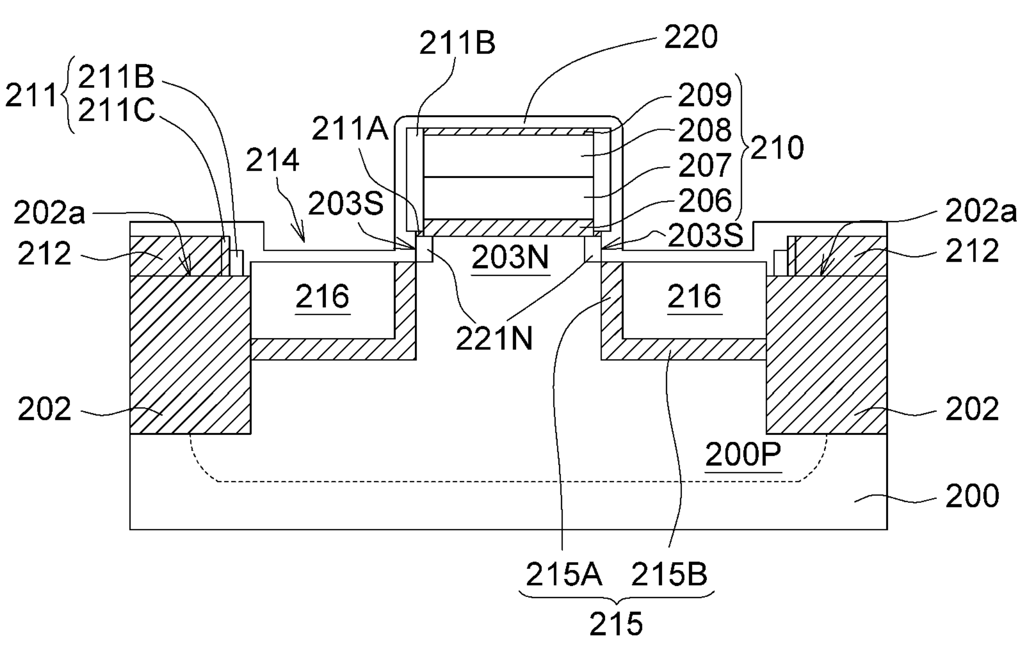
FIG. 2J(2)

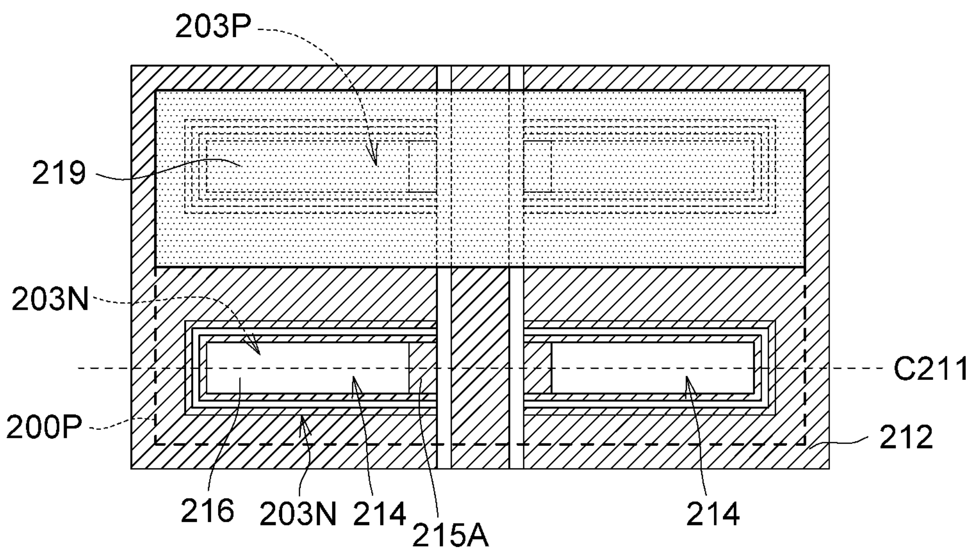
FIG. 2K(1)
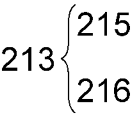
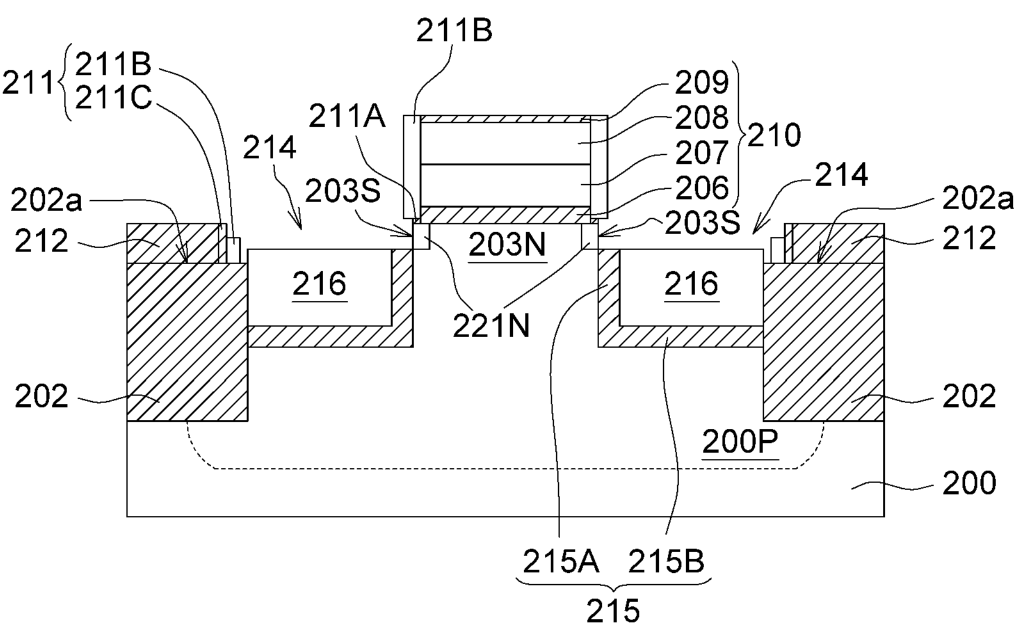
FIG. 2K(2)

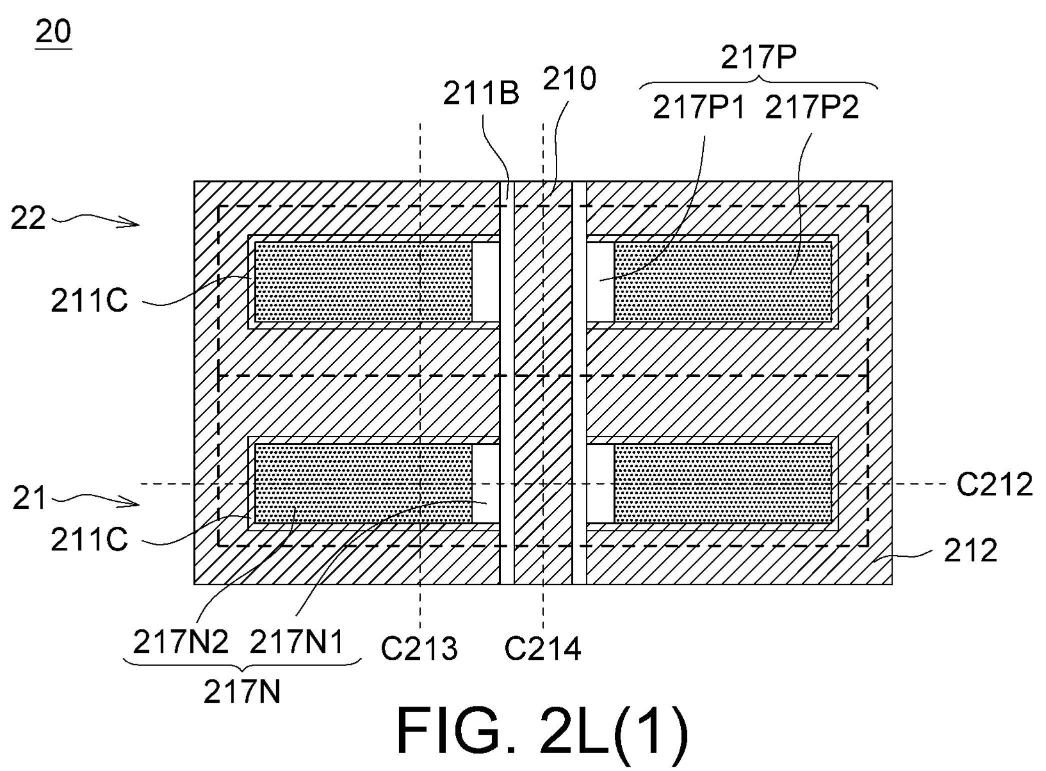
FIG. 2L(1)
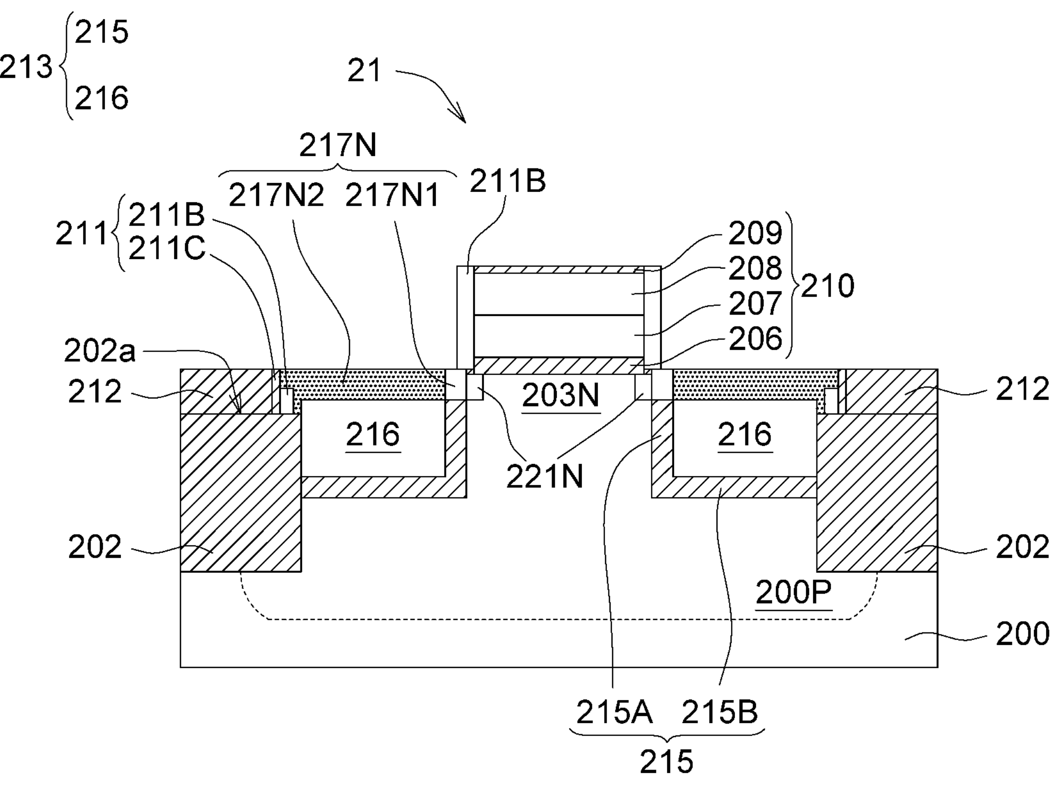
FIG. 2L(2)

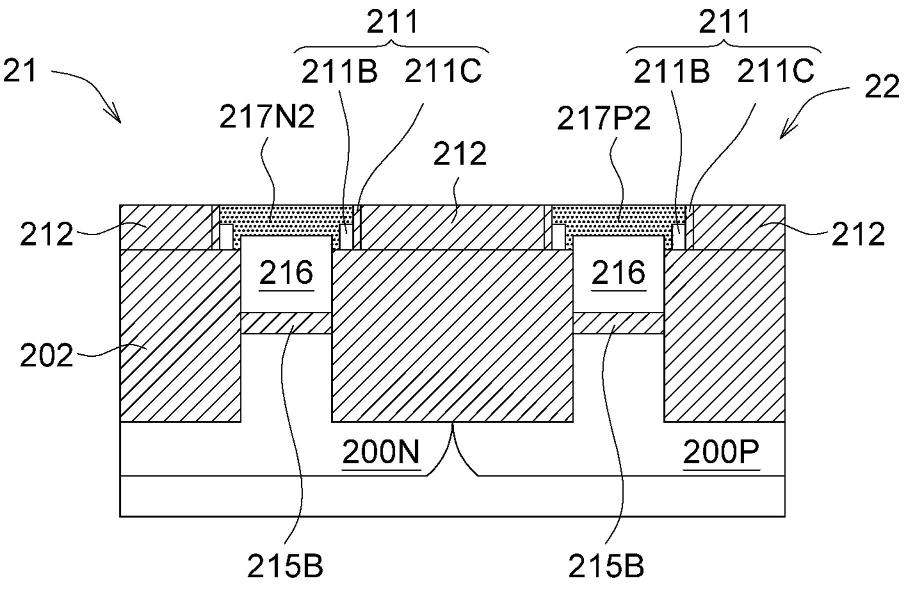
FIG. 2L(3)

PLANAR MOSFET WITH LIGHT, REGULAR AND HEAVILY DOPED REGIONS

This application claims the benefit of U.S. provisional application Ser. No. 63/359,231 filed Jul. 8, 2022, the subject matter of which is incorporated herein by reference.

BACKGROUND OF THE DISCLOSURE

Field of the Disclosure

The disclosure relates in general to a semiconductor structure and the method for fabricating the same, and more particularly to a MOSFET structure and the method for fabricating the same.

Description of the Related Art

The success of low power integrated circuits industry is primarily due to the complementary metal oxide semiconductor (CMOS) technology, wherein the key role of integrated circuits is the MOSFET (metal-oxide-semiconductor field-effect transistor). Although advanced technology nodes (such as 3-16 nm) for fin structure transistors are frequently used in high performance computing applications (such as Artificial Intelligence AI, CPU, GPU, etc.), the mature technology nodes (such as 22-120 nm) for planar MOSFET are still popular in many IC applications, such as, power management IC, DRAM, and MCU chip.

FIG. 1 shows a state-of-the-art planar CMOS device 10 which includes a PMOS transistor 11 and a NMOS transistor 12. The transistor gate structure 11G/12G using some conductive material (like metal, poly-silicon or silicide, etc.) over an insulator (such as oxide, oxide/nitride or some high-k dielectric, etc.) is formed on top of a silicon surface, and the CMOS device 10 are isolated from those of other transistors (not shown) by using insulation materials 103 (e.g. oxide or oxide/nitride or other dielectrics). For an NMOS transistor 12, there are source and drain regions 12S/D which are formed by an ion-implantation plus thermal annealing technique to implant n-type dopants into a p-type substrate 100 (or a p-well) which thus results in two separated n+/p junction areas 104. For the PMOS transistor 11 both source and drain regions 11S/D are formed by ion-implanting p-type dopants into an n-well which thus results in two p+/n junction areas 104.

However, during the previously mentioned thermal annealing process, the implanted n-type or p-type dopants will unavoidably diffuse into different directions and enlarge the area of the source and drain regions. The larger the area of the source and drain regions due to the thermal annealing processes, the shorter of the effective channel length between the source and drain regions, and such reduced effective channel length (Leff) will incur short channel effect (SCE). An MOS transistor could be considered to be shorted when the Leff is comparable to the source/drain junction depletion width. When the Leff is further reduced, the drain current finally cannot be turned off and the gate has no control over the charge. The so-called punch-through effect poses a severe problem for miniaturized devices. Therefore, to reduce the impact of SCE, it is common to reserve longer gate length to accommodate the diffusion of n-type or p-type dopants due to thermal annealing. Using technology node of 25 nm (Lamda or λ) as an example, the reserved gate length would be 60 nm to 100 nm. Thus, the size of the transistor could not be proportionally shrunk.

Other problems are introduced or getting worse in current planar MOSFETs made by mature technology nodes of 120 nm to 22 nm: (1) All junction leakages resulted by junction formation processes, such as forming lightly-doped drain (LDD) structure into the substrate/well regions, forming n+ source/drain structures into p-substrate and forming p+ source/drain structures into n-well, are getting worse to control, since leakage currents occur through both perimeter and bottom areas where extra damages like vacant traps for holes and electrons are harder to be reconciled due to lattice imperfections which have been created by ion-implantation; (2) In addition, since the ion-implantation to form the LDD structure (or the n+/p junction or the p+/n junction) works like bombardments in order to insert ions from the top of a silicon surface straight down to the substrate, it is hard to create uniform material interfaces with lower defects from the source and drain regions to the channel and the substrate-body regions since the dopant concentrations are non-uniformly distributed vertically from the top surface with higher doping concentrations down to the junction regions with lower doping concentrations; (3) It's getting harder to align the LDD junction edge to the edge of gate structure in a perfect position by only using the conventional self-alignment method of using gate, spacer and ion-implantation formation. In addition, the thermal annealing process for removing the ion-implantation damages must count on high temperature processing techniques such as rapid thermal annealing method by using various energy sources or other thermal processes. One problem thus created is that a gate-induced drain lowering (GIDL) leakage current is badly induced due to a gated diode structure formed in the gate-to-source/drain regions and hard to be controlled regardless the fact that it should be minimized to reduce leakage currents, the other problem as created is that the effective channel length is difficult to be controlled and so the short channel effect is hardly minimized. (4) As the dimensions of the transistors are continuously scaled down, manufacture parameter fluctuations cause undesirable result and impact on the circuit performance, for example, line edge roughness (LER), random dopant fluctuations (RDFs) and poly grain granularity (PGG), will unavoidably incur the variation of gate length (or the effective channel length) and then the threshold voltage $V_T$ variation, as shown in FIG. 1.

Therefore, there is a need to provide an advanced transistor structure and the processing method therefor to overcome the drawbacks of the prior art.

SUMMARY OF THE DISCLOSURE

This invention discloses several new concepts of realizing a novel transistor structure, such as a planar transistor, which greatly improves or even solved most of the problems as stated above, such as minimizing current leakages, increasing channel-conduction performance and control, optimizing functions of source and drain regions such as making better their conductance to metal interconnections and their closest physical intact to the channel region with a seamless orderly crystalline lattice matchup.

One aspect of the present disclosure is to provide a MOSFET structure, wherein the MOSFET structure includes a semiconductor substrate, a gate region, a first trench, a first isolation region and a first conductive region. The semiconductor substrate is with an original semiconductor surface. The gate region is over the original semiconductor surface. The first trench is formed below the original semiconductor surface. The first isolation region is in the first trench. The first conductive region is with a first doping region and a second doping region; wherein the first doping region is within the semiconductor substrate and the second doping region is physically spaced apart from or formed outside the semiconductor substrate.

In one embodiment of the present disclosure, both the first doping region and the second doping region are not formed by ion implantation process.

In one embodiment of the present disclosure, a process to form the first doping region is different from a process to form the second doping region.

In one embodiment of the present disclosure, the first conductive region is a lightly doped region.

In one embodiment of the present disclosure, the first doping region is formed by thermally annealing a deposited in-situ doped semiconductor layer, and the second doping region is formed by selective growth based on the first doping region.

In one embodiment of the present disclosure, the second doping region includes a highly doped region and a regularly doped region, and the first doping region includes a lightly doped region, the concentration of the highly doped region is greater than the concentration of the regularly doped region, and the concentration of the regularly doped region is greater than the concentration of the lightly doped region.

In one embodiment of the present disclosure, the first isolation region includes a L-shape oxide layer.

Another aspect of the present disclosure is to provide a transistor structure, wherein the transistor structure includes a semiconductor substrate with an original semiconductor surface, a first transistor and a second transistor. The first transistor includes a first gate, a first trench, a first isolation region and a first conductive region. The first gate region is over the original semiconductor surface. The first trench is formed below the original semiconductor surface. The first isolation region is in the first trench. The first conductive region includes a first doping region and a second doping region; wherein the first doping region is within the semiconductor substrate and the second doping region is physically spaced apart from or outside the semiconductor substrate. The second transistor includes a second gate, a second trench, a second isolation region and a second conductive region. The second gate region is over the original semiconductor surface. The second trench is formed below the original semiconductor surface. The second isolation region is in the second trench. The second conductive region includes a third doping region and a fourth doping region; wherein the third doping region is within the semiconductor substrate and the fourth doping region is physically spaced apart from or outside the semiconductor substrate; wherein the doping concentration of the first doped region is different from the doping concentration of third doping region.

In one embodiment of the present disclosure, the doping concentration of the second doped region is the same or substantially the same as the doping concentration of fourth doping region.

In one embodiment of the present disclosure, a threshold voltage of the first transistor is different from that of the second transistor.

In one embodiment of the present disclosure, the first doping region is formed by thermally annealing a first deposited in-situ doped semiconductor layer, and the third doping region is formed by thermally annealing a second deposited in-situ doped semiconductor layer, and the concentration of the first deposited in-situ doped semiconductor layer is different from the concentration of the second deposited in-situ doped semiconductor layer.

Another aspect of the present disclosure is to provide a MOSFET structure, wherein the MOSFET structure includes a semiconductor substrate with an original semiconductor surface, a first transistor and a second transistor. The first transistor includes a first gate, a first trench, a first isolation region and a first conductive region. The first gate region is over the original semiconductor surface. The first trench is formed below the original semiconductor surface. The first isolation region is in the first trench. The first conductive region includes a first doping region and a second doping region. The second transistor includes a second gate, a second trench, a second isolation region and a second conductive region. The second gate region is over the original semiconductor surface. The second trench is formed below the original semiconductor surface. The second isolation region is in the second trench. The second conductive region includes a third doping region and a fourth doping region. Wherein the first doped region and third doping region are formed simultaneously by a thermal annealing process.

In one embodiment of the present disclosure, the doping concentration of the first doped region is different from the concentration of third doping region.

In one embodiment of the present disclosure, wherein the first doping region is formed by thermally annealing a first deposited in-situ doped semiconductor layer, and the third doping region is formed by thermally annealing a second deposited in-situ doped semiconductor layer.

In one embodiment of the present disclosure, the doping concentration of the second doped region is the same or substantially the same as the concentration of fourth doping region.

BRIEF DESCRIPTION OF THE DRAWINGS

The above and other aspects of the disclosure will become better understood with regard to the following detailed description of the preferred but non-limiting embodiment(s). The following description is made with reference to the accompanying drawings:

FIG. 2A(1) is a top view illustrating a structure having a patterned pad-nitride layer and a patterned pad-oxide layer disposed on top surface of at least one active island region which is well defined on a fin structure after forming a first STI region, according to one embodiment of the present disclosure;

FIG. 2A(2) is a cross-sectional view taken along the cutting line C21 as depicted in FIG. 2A(1);

FIG. 2B(1) is a top view illustrating a partial structure after a gate structure is formed on the top surface of the at least one active island region, according to one embodiment of the present disclosure;

FIG. 2B(2) is a cross-sectional view taken along the cutting line C22 as depicted in FIG. 2B(1);

FIG. 2C(1) is a top view illustrating the partial processing structure after the gate region is formed on the top surface of the at least one active island region, according to one embodiment of the present disclosure;

FIG. 2C(2) is a cross-sectional view taken along the cutting line C23 as depicted in FIG. 2C(1);

FIG. 2D(1) is a top view illustrating the partial processing structure after a second STI region is formed on the first STI region, according to one embodiment of the present disclosure;

FIG. 2D(2) is a cross-sectional view taken along the cutting line C24 as depicted in FIG. 2C(1).

FIG. 2E(1) is a top view illustrating the partial processing structure after at least one isolation region is formed in the at least one active island regions, according to one embodiment of the present disclosure;

FIG. 2E(2) is a cross-sectional view taken along the cutting line C25 as depicted in FIG. 2E(1);

FIG. 2F(1) is a top view illustrating the partial processing structure after a thermal oxide layer is on the bottom and the sidewalls of the at least one trench, according to one embodiment of the present disclosure;

FIG. 2F(2) is a cross-sectional view taken along the cutting line C26 as depicted in FIG. 2F(1);

FIG. 2G(1) is a top view illustrating the partial processing structure after at least one isolation region is formed, according to one embodiment of the present disclosure;

FIG. 2G(2) is a cross-sectional view taken along the cutting line C27 as depicted in FIG. 2G(1);

FIG. 2H(1) is a top view illustrating the partial processing structure after at least one undercut is formed below the composite spacer, according to one embodiment of the present disclosure.

FIG. 2H(2) is a cross-sectional view taken along the cutting line C28 as depicted in FIG. 2H(1);

FIG. 2I(1) is a top view illustrating the partial processing structure after an in-situ n-type doped polysilicon layer is formed to cover the exposed portion of the at least one active island region, according to one embodiment of the present disclosure;

FIG. 2I(2) is a cross-sectional view taken along the cutting line C29 as depicted in FIG. 2I(1);

FIG. 2J(1) is a top view illustrating the partial processing structure after at least one LDD region is formed in the active island region, according to one embodiment of the present disclosure;

FIG. 2J(2) is a cross-sectional view taken along the cutting line C210 as depicted in FIG. 2J(1);

FIG. 2K(1) is a top view illustrating the partial processing structure after the in-situ n-type doped polysilicon layer is removed, according to one embodiment of the present disclosure;

FIG. 2K(2) is a cross-sectional view taken along the cutting line C211 as depicted in FIG. 2K(1);

FIG. 2L(1) is a top view illustrating the partial processing structure after at least one conductive region is formed, according to one embodiment of the present disclosure;

FIG. 2L(2) is a cross-sectional view taken along the cutting line C212 as depicted in FIG. 2L(1);

FIG. 2L(3) is a cross-sectional view taken along the cutting line C213 as depicted in FIG. 2L(1);

DETAILED DESCRIPTION OF THE DISCLOSURE

Figure 1:
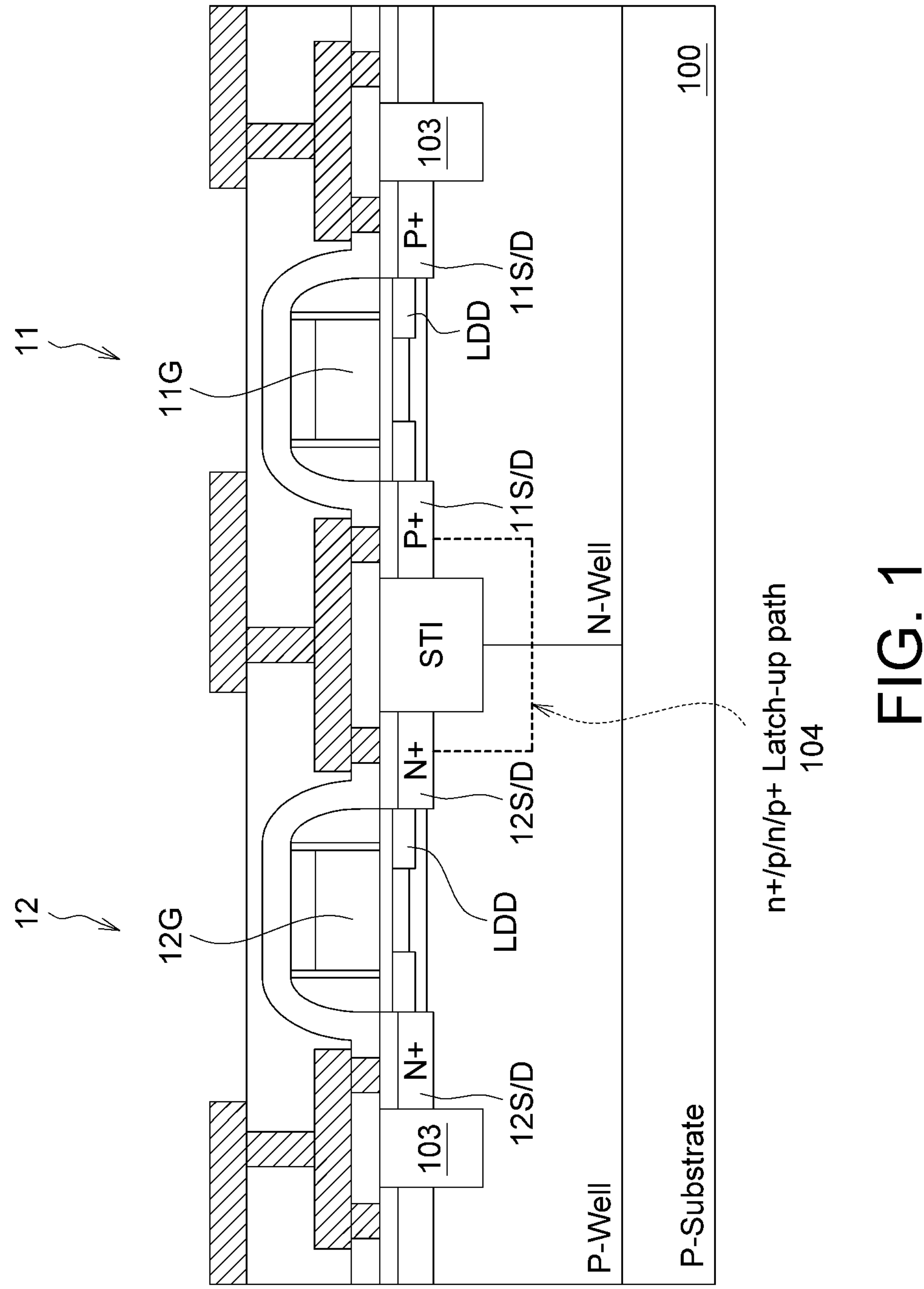
FIG. 1 is a cross-sectional view illustrating a planar CMOS device which includes a PMOS transistor and a NMOS transistor according to the prior art.

The present disclosure provides a transistor structure and the processing method thereof. The above and other aspects of the disclosure will become better understood by the following detailed description of the preferred but non-limiting embodiment(s). The following description is made with reference to the accompanying drawings:

Several embodiments of the present disclosure are disclosed below with reference to accompanying drawings. However, the structure and contents disclosed in the embodiments are for exemplary and explanatory purposes only, and the scope of protection of the present disclosure is not limited to the embodiments. It should be noted that the present disclosure does not illustrate all possible embodiments, and anyone skilled in the technology field of the disclosure will be able to make suitable modifications or changes based on the specification disclosed below to meet actual needs without breaching the spirit of the disclosure. The present disclosure is applicable to other implementations not disclosed in the specification.

A simple planar NMOS which made in a p-type substrate (or p-well) is used as an example to illustrate the manufacture processes and key attributes of this invention, while similar processes and structures could also be applied to a planar PMOS transistor which is made in a N-well of the p-type substrate.

Embodiment 1

The flowing description discloses the step for forming a transistor structure 20 according to one embodiment of the present disclosure. In the present embodiment of the present disclosure, the transistor structure 20 may include a CMOS device which includes a NMOS transistor 21 formed in a p-well 200P of a p type semiconductor substrate (e.g., p type silicon substrate) 200 and a PMOS transistor 22 formed in an N well 200N of the semiconductor substrate 200. The forming of the transistor structure 20 includes steps as follows:

- Step S21: define at least one fin region (or active region) in a semiconductor substrate using a patterned pad-nitride layer and a patterned pad-oxide layer as an etching mask.
- Step S22: forming a first shallow trench isolation (STI) region surrounding the fin structure (or active island region).
- Step S23: forming a gate structure including the gate dielectric on the top surface of the active island region. The forming of the gate region includes sub-steps S231-S232:
  - sub-step S231: sequentially forming a gate dielectric layer, a metal layer, a SiN cap layer and an oxide cap layer to cover the active island region; and
  - sub-step S232: etching the oxide cap layer, the SiN cap layer, the metal layer, and the gate dielectric layer to remain the portions of the oxide cap layer, the SiN cap layer, the metal layer and the gate dielectric layer stacked on the surface of the active island region;
- Step S24: forming a composite spacer on the sidewalls of the gate structure (and the sidewalls of the active island region if necessary). The forming of the composite spacer includes sub-steps S241-S245:
  - sub-step S241: forming a thermal thin oxide film on the exposed portions of the top surface and the sidewall of the active island region;

sub-step S242: depositing a nitride layer covering the gate structure and the thermal thin oxide film;

sub-step S243: etching the nitride layer and the thermal thin oxide film to expose a portion of the top surface of the active island region;

sub-step S244: depositing another oxide layer covering the gate structure, the remaining portions of the nitride layer and the thermal thin oxide film and the exposed portion of the top surface of the active island region; and sub-step S245: etching the oxide layer to expose a portion of the top surface of the active island region.

step S25: forming a second STI region on the first STI region with a top surface substantially aligning to the top surface of the active island region.

Step S26: forming at least one isolation region with L-shape oxide layer in the active island region. The forming of the isolation region includes sub-steps S261-S264:

sub-step S261: forming at least one trench below the top surface of the active island region;

sub-step S262: forming a thermal oxide layer on the bottom and the sidewalls of the trench;

sub-step S263: filling a dielectric material in the trench; and sub-step S264: etching back the dielectric material to expose a portion of the thermal oxide layer disposed on the sidewalls of the trench;

Step S27: forming at least one conductive region positioned over the isolation region and being independent from the semiconductor substrate. The forming of the conductive region includes sub-steps S271-S276:

sub-step S271: removing the exposed portion of the thermal oxide layer to form at least one undercut below the composite spacer and partially expose a portion of the active island region;

sub-step S272: depositing an in-situ n-type doped poly-silicon layer to cover the exposed portion of the active island region;

sub-step S273: performing a thermal annealing process to form an LDD region in the active island region extending from the exposed semiconductor surface of the active island region;

sub-step S274: removing the in-situ n-type doped poly-silicon layer; and sub-step S275: forming a selective growth conductive region based on the LDD region.

Referring to Step S21 and S22: Please refer to FIG. 2A(1) and FIG. 2A(2) which is a cross-sectional view taken along the cutting line C21 as depicted in FIG. 2A(1), the fin structures 201N and 201P (or the active island regions 203N and 203P) are formed by steps as follows: a pad-nitride layer 204 and a pad-oxide layer 205 are formed in sequence to cover a surface of the semiconductor substrate 200. Next, the pad-nitride layer 204 and the pad-oxide layer 205 are patterned by a photoresist etching process, and an anisotropic etching (not shown), Thus, fin regions or active regions are defined. Then, using the patterned pad-nitride layer 204 and the patterned pad-oxide layer 205 as an etching mask to remove a portion of the semiconductor substrate 200 and form the fin structures 201N and 201P respectively in a P well and an N well of the semiconductor substrate 200. Subsequently, the first STI region 202 is formed by a dielectric deposition process surrounding the fin structures or the active island regions 203N and 203P.

As shown in FIG. 2A(2), the since the top surface 202*a* of the first STI region 202 is made below the top surface 203*t* (the original silicon surface (SOS)) of the fin structures 201P and 201N (active island regions 203P and 203N), four silicon sidewalls 203*v* of the active island regions 203P and 203N above the top surface 202*a* of the first STI region 202 are exposed.

Referring to Step S23: forming a gate structure 210 on the top surface 203*t* of the active island regions 203N and 203P. FIG. 2B(1) is a top view illustrating a partial structure after the gate structure 210 is formed on the top surface 203*t* of the active island regions 203N and 203P, according to one embodiment of the present disclosure. FIG. 2B(2) is a cross-sectional view taken along the cutting line C22 as depicted in FIG. 2B(1). The forming of the gate region includes sub-steps S231-S232:

Referring to sub-step S231: After the pad-nitride layer 204 and the pad-oxide layer 205 are removed, a series deposition processes (e.g., low pressure chemical vapor deposition (LPCVD)) are performed to sequentially deposit the gate dielectric layer 206, the gate conductive layer (such as suitable metal) 207, the SiN cap layer 208 and the oxide cap layer 209 covering the top surface 203*t* of the active island regions 203N and 203P and the top surface 202*a* of the first STI region 202. In the present embodiment, the gate dielectric layer 206 can be an oxide layer or a High-K dielectric layer; the metal layer 207 may be a composite layer including a TiN/Ti barrier layer and a tungsten (W) layer (not shown).

Referring to sub-step S232: first. using a patterned photoresist layer on the oxide cap layer 209 as an etching mask; and then etching process is performed to remove portions of the oxide cap layer 209, the SiN cap layer 208, the metal layer 207 and the gate dielectric material layer 206. Such that, the remaining portions of the metal layer 207, the oxide cap layer 209 and the SiN cap layer 208 can be combined to from the gate structure 210 (as shown in FIG. 2B(2)).

Referring to Step S24: forming a composite spacer 211 on the sidewalls 210*s* of the gate structure 210 and the at least one active island region (e.g. the active island regions 203N and 203P). FIG. 2C(1) is a top view illustrating the partial processing structure after the composite spacer 211 is formed. FIG. 2C(2) is a cross-sectional view taken along the cutting line C23 as depicted in FIG. 2C(1). The forming of the composite spacer 211 includes sub-steps S241-S245:

Referring to sub-step S241: First, a thermal thin oxide film 211A is formed by a thermal oxidation process, and growth on the exposed portions of the top surface 203*t* and the four silicon sidewalls 203*v* of the fin structure 201N and the fin structure 201P.

Referring to sub-step S242: Then, a deposition process (e.g., a low pressure chemical vapor deposition (LPCVD)) is performed to form the nitride layer 211B covering the gate structure 210, the fin structures 201N and 201P, the thermal thin oxide film 211A and the first STI region 202.

Referring to sub-step S243: Afterward, an anisotropic etching process (such as, a dry etching or a reactive-ion etching (RIE)) is performed to remove the portions of the nitride layer 211B and the thermal thin oxide film 211A. Such that, a portion of the nitride layer 211B is remained on the sidewalls of the gate structure 210, and another portion of the nitride layer 211B is remained and stacked on the portions of the thermal thin oxide film 211A.

Referring to sub-step S244: Furthermore, another deposition process (e.g., a low pressure chemical vapor deposition (LPCVD)) is performed to form the oxide layer 211C at least covering the first STI region 202, the gate structure 210, the remaining portion of the nitride layer 211B.

Referring to sub-step S245: Then, an anisotropic etch is performed to remove the portion of the oxide layer 211C. Such that, a portion of the oxide layer 211C is remained on the top surface 202*a* of the first STI region 202, a portion of the oxide layer 211C is remained and stacked on the portion of the nitride layer 211B that is remained on the sidewalls of the gate structure 210. The remained portions of the thermal thin oxide film 211A, the nitride layer 211B and the oxide layer 211C are combined to from the composite spacer 211.

Referring to Step S25: forming a second STI region 212. FIG. 2D(1) is a top view illustrating the partial processing structure after the second STI region 212 is formed on the first STI region 202, according to one embodiment of the present disclosure. FIG. 2D(2) is a cross-sectional view taken along the cutting line C24 as depicted in FIG. 2C(1). First, depositing dielectric material, such as silicon oxide, covering on the first STI region 202, the gate structure 210 and the active island regions 203N and 203P; and then performing an etching back process to remain the portion of the dielectric material (that is, the second STI region 212) deposited on the first STI region 202. Wherein the top surface of the second STI region 212 could be aligned with the top surface 203*t* (the original silicon surface (SOS)).

Referring to Step S26: forming at least one isolation region 213 with L-shape oxide layer in the at least one active island region (e.g. the active island regions 203N and 203P). The forming of the isolation region includes sub-steps S261-S264:

Referring to sub-step S261: Please refer to FIG. 2E(1) and FIG. 2E(2) which is a cross-sectional view taken along the cutting line C25 as depicted in FIG. 2E(1). First, an anisotropic etching process (such as, a dry etching or a RIE) is performed using the gate structures 210 and the portions of the composite spacer 211 disposed on the sidewalls of the gate structures 210 as the etching mask to remove portions of the active island regions 203N and 203P to form a plurality of trenches 214 in the active island regions 203N and 203P.

Wherein, the trenches 214 formed in the active island regions 203N and 203P are below the top surface 203*t* of the active island regions 203N and 203P. Each of the trenches 214 has a bottoms 214*b*. In some embodiments, the depth of the trenches 214 may be from 100 nm to 120 nm (such as, 110 nm). Each of the trenches 214 may be surrounded by sidewalls of the first STI region 202 and a semiconductor surface 203*s* of the etched active island region 203N or 203P with (110)-oriented silicon right under the portion of the composite spacer 211 disposed on the gate structure 210.

Referring to sub-step S262: Please refer to. FIG. 2F(1) and FIG. 2F(2) which is a cross-sectional view taken along the cutting line C26 as depicted in FIG. 2F(1). Then, a thermal oxidation process is performed to grow the thermal oxide layer 215 (such as, a silicon oxide layer) on the bottoms and the sidewalls of each trench 14. Thus, the thermal oxide layer 215 is a L-shape oxide. The portion of the thermal oxide layer 215 formed in each of the trenches 214 has a thermal oxide vertical portion 215A (or oxide-V) penetrating in to the semiconductor substrate (i.e., the etched active island region 203N or 203P) from the original exposed vertical sidewall (e.g. the semiconductor surface 203*s* with (110)-oriented silicon) of each trench 214, and a thermal oxide bottom portion 215B (or oxide-B) penetrating in to the semiconductor substrate (i.e., the etched active island region 203N or 203P) from the bottom 214*b* of each trench 214.

In one embodiment, the thickness of the thermal oxide vertical portion 215A and the thermal oxide bottom portion 215B could be around 20 nm. However, it is important to design this thermal oxidation process such that the thickness of the thermal oxide vertical portion 215A can be very accurately controlled under both precisely controlled thermal oxidation temperature, timing and growth rate. The thermal oxidation over a well-defined silicon surface result in that 40% of the thickness of the thermal oxide vertical portion 215A extends into the transistor body (the etched active island region 203N or 203P) from the exposed vertical sidewall (the semiconductor surface 203*s* with (110)-oriented silicon), and that the remaining 60% of the thickness of the thermal oxide vertical portion 215A counted as an addition part extends into the trenches 214 from the vertical sidewall (the semiconductor surface 203*s*).

Since the thickness of the thermal oxide vertical portion 215A is very accurately controlled based on the thermal oxidation process, the edge of the thermal oxide vertical portion 215A could be controlled, such as the gap G between the edge 215*e* of the thermal oxide vertical portion 215A and the edge 210*e* of the gate region 210 is well controlled, such as around 2 nm to 4 nm or less (as shown in FIG. 2E(2)).

Referring to sub-step S263: Please refer to FIG. 2G(1) and FIG. 2G(2) which is a cross-sectional view taken along the cutting line C27 as depicted in FIG. 2G(1). The dielectric material 216, such as silicon nitride, is then deposited over the gate region 210 and the thermal oxide layer 215 with sufficient thickness to fully fill up both the trenches 214.

Referring to sub-step S264: Afterward, an etching back process is performed to remove the unnecessary portion of the dielectric material 216 to leave only a suitable thickness of the dielectric material 216 (also referred to as filling dielectric regions) inside the trenches 214 (which are not fully filled). Wherein the portions of the thermal oxide layer 215 and the remaining dielectric material 216 that are disposed in one of the trenches 214 can be combined to serve as one of the isolation regions 213, which is also referred to as a localized isolation into silicon substrate (LISS). It is noticed that there is a gap 216*g* between the top surfaces 203*t* of the active island regions 203N and 203P and the top surface 216*t* of the remaining dielectric material 216 ranging around 6 nm to 12 nm (such as, 9 nm). Such that, the top portions of the thermal oxide vertical portions 215A can be exposed from the unfilled trenches 214 (as shown in FIG. 2G2)).

Referring to Step S27: forming at least one conductive region (such as the conductive regions 217N and 217P) positioned on the at least one isolation region 213 and being independent from the semiconductor substrate (i.e., the etched active island region 203N or 203P). The forming of the conductive region (e.g. conductive regions 217A and 217B) includes sub-steps S251-S254.

Referring to sub-step S271: Please refer to. FIG. 2H(1) and FIG. 2H(2) which is a cross-sectional view taken along the cutting line C28 as depicted in FIG. 2H(1). First, a well-designed anisotropic etching (such as wet etching) process is performed to remove the top portions of the thermal oxide vertical portion 215A within the trenches 214 (meanwhile a portion of the thermal thin oxide film 211A underneath the nitride layer 211B covering the gate structure 210 and portions of the portions of the thermal thin oxide film 211A and the oxide layer 211C constituting the composite spacer 211 can be both also removed). Such that, a plurality of undercuts 218 below the portion of the composite spacer 211 are respectively formed in the trenches 214. That is, the semiconductor surfaces of the etched active island region 203N or 203P with (110)-oriented silicon are exposed from the undercuts 218 and the unfilled trenches 214.

It is noted that each portion of the semiconductor surface exposed form one of the undercuts 218 has a vertical boundary with a suitable recessed thickness, and the undercuts 218 are just right underneath the composite spacer 211, rather than the gate structure 210. Thus, it is guaranteed that the portion of the gate dielectric layer 206 under the gate structure 210 is unetched and remains it completeness.

Referring to sub-step S272: Please refer to FIG. 2I(1) and FIG. 2I(2) which is a cross-sectional view taken along the cutting line C29 as depicted in FIG. 2I(1). First, a patterned photo resist layer 219 is firstly formed to block the active island region 203P and expose the active island region 203N. An in-situ deposition process (e.g., a LPCVD process) is then performed to deposit n-type doped polysilicon 220 coving the second STI region 212, remained portions of the composite spacer 211 and the active island region 203N and full filling the trenches 214 and the undercuts 218. Subsequently, an etching process is performed to remove the unnecessary portion of the deposited n-type doped polysilicon, so as to form the in-situ n-type doped polysilicon layer 220. The doping concentration of the n-type ions (such as, phosphorus, antimony, and arsenic ions) doped in the in-situ n-type doped polysilicon layer 220 may range about $5\times10^{18}/cm^3$ to $1\times10^{19}/cm^3$. After the in-situ n-type doped polysilicon layer 220 is formed, another in-situ p-type doped polysilicon layer (not shown) could be deposited over the active island region 203P based on similar processes. Thus, the in-situ n-type doped polysilicon layer 220 and in-situ p-type doped polysilicon layer could be existed over the active island region 203N and the active island region 203P, respectively. Moreover, through different patterned photo resists, it is possible that different active island region could be covered by different doping concentration in-situ doped polysilicon layer.

Referring to sub-step S273: Please refer to FIG. 2J(1) and FIG. 2J(2) which is a cross-sectional view taken along the cutting line C210 as depicted in FIG. 2J(1). Then, a rapid thermal annealing (RTA) is carried out to thermally derive the n-type ions doped in the in-situ n-type doped polysilicon layer 220 passing through the semiconductor surface 203*s* and into the active island region 203N, so as to form the n-type LDD region 221. Since the n-type LDD region 221N is formed in the active island region 203N and includes the expose semiconductor surface 203*s* with (110)-oriented silicon, thus the LDD region can be used as crystalline seeds to form a new well-organized (110) lattice source/drain region. Meanwhile, the same rapid thermal annealing (RTA) also thermally derives the p-type ions doped in the in-situ p-type doped polysilicon layer into the active island region 203P, so as to form the p-type LDD region (not shown). Therefore, by using one thermal annealing step, n-type LDD regions and p-type LDD regions are simultaneously formed in the active island region 203N and the active island region 203P, respectively. Moreover, since different active island region could be covered by different doping concentration in-situ doped polysilicon layer, after thermal annealing step, different active island region could have different LDD region with different doping concentrations.

Therefore, the aforesaid in-situ doped LDD region with different doping concentration in different active island region provides flexible threshold voltage adjustment for different type of PMOS and NMOS. It could be combined with different work function metal process for different PMOS and NMOS to achieve normal threshold voltage, high threshold voltage, or low voltage transistor devices.

Referring to sub-step S274: Please refer to FIG. 2K(1) and FIG. 2K(2) which is a cross-sectional view taken along the cutting line C211 as depicted in FIG. 2K(1). Use an anisotropic etching process (such as, wet etching, dry etching or a reactive-ion etching (RIE)) is performed to remove the in-situ n-type doped polysilicon layer 220, so as to expose the n-type LDD region 221N. Of course, the in-situ p-type doped polysilicon layer could be removed as well to expose the p-type LDD region in the active island region 203P (not shown).

Referring to sub-step S275: Please refer to FIG. 2L(1) and FIG. 2L(2) which is a cross-sectional view taken along the cutting line C212 as depicted in FIG. 2L(1). FIG. 2L(3) is a cross-sectional view taken along the cutting line C213 as depicted in FIG. 2L(1). A selective growth technique (such as, selective epitaxial growth (SEG) or other suitable technology which may be atomic layer deposition (ALD) or selective growth (ALD-SALD)) to grow the first selective growth portion 217N1 based on the exposed silicon surface of the n-type LDD region 221N. The first selective growth portion 217N1 has an n-type electricity and can be used as crystalline seeds to form another new well-organized (110) lattice regions (i.e., the second selective growth portion 217N2 later formed). The doping concentration of the first selective growth portion 217N1 may range about $1\times10^{19}/cm^3$ to $4\times10^{20}/cm^3$ which is greater than that of the n-type LDD region 221N.

Afterward, another selective growth process (or continuous selective growth process) is performed to grow N+ doped regions along the vertical wall of the first selective growth portion 217N1 with (110) orientation, so as to form the second selective growth portion 217N2 within the trenches 214 and extending on the dielectric material 216. Wherein, the second selective growth portion 217N2 is physically spaced apart from the semiconductor substrate (of the active island region 203N) by the isolation region 213 (including the thermal oxide layer 215 and the dielectric material 216). The combination of the first selective growth portion 217N1 and the second selective growth portion 217N2 may be referred to as the conductive regions 217N serving as the major portion of the source/drain regions of the NMOS transistor 21.

The doping concentration of the second selective growth portion 217N2 (also referred as an N+ doped region) may range about $4\times10^{20}/cm^3$ to $1\times10^{21}/cm^3$, which is greater than that of the first selective growth portion 217N1 (also referred as a regularly doped region). In some other embodiments of the present disclosure, the first selective growth portion 217N1 and the second selective growth portion 217N2 for different NMOS devices in the same wafer have all the same doping concentrations. That is, the doping concentrations of all first selective growth portion 217N1 in different NMOS devices are the same, the doping concentrations of all second selective growth portion 217N2 in different NMOS devices are the same as well. Such that, the process flow for forming the source region or the drain region of the NMOS transistor 21 can reduce multiple selective epitaxy growth process steps and keep only one time to run selective epitaxy growth process step.

Similarly, the PMOS transistor 22 can be formed by the same process as described above. For example, a conductive region 217P (serving as major portion of the source/drain regions of the PMOS transistor 22) can be formed in the active island region 203P by repeating the process as depicted in FIGS. 2I(1)-2L(2), except forming an in-situ p-type doped polysilicon layer and performing a selective epitaxial growth both with different conductive property. The n-type ions of the n-type LDD region 221N and the p-type LDD region (not shown) may be further thermally driven to diffuse deeper by the later process for forming the conductive regions 217N and 217P.

After a series steps of down-stream process are performed, the forming of the transistor structure (e.g., the CMOS device) 20 can be implemented (as shown in FIG. 2L(1) and FIG. 2L(2)).

It is noticed that, in the present invention there could be two or more separate steps in one selective growth process, the first one is lateral selective growth of the n-type selective growth portion (e.g., the first selective growth portion 217N1) or the p-type selective growth portion (e.g., the first selective growth portion 217P1), and the second one is lateral selective growth of N+(e.g. second selective growth portion 217N2) or P+ doped regions (e.g., the second selective growth portion 217P2). The growth temperature of the first step could be different form that of the second step. So is the doping concentrations for those two steps. Moreover, the grown material (such as Si) of the first step could be different from the grown material (such as, SiGe, SiC, W, or other selective grown material) of the second step in order to reduce the resistances of Source/Drain regions or increase the stress force to the initial portions of Source/Drain regions into the channel region to increase mobility.

After this SEG processes for forming the source/drain regions (the conductive regions 217N and 217P) are completed, there are some novel results achieved:

(1) The new source/drain regions formed by all (110)-oriented crystalline silicon can improve the performance of the source/drain regions, in comparison with that formed by conventional way of growing from two different seeding regions to cause lattice mixtures of (100)-oriented silicon and (110)-oriented silicon;

(2) The well-defined (110) crystalline of the newly grown silicon structures is closely seamless with the effective channel length and perfectly intact, which gives exactly controlled size of transistor width;

(3) As mentioned, in the present invention, by using one thermal annealing step, n-type LDD regions and p-type LDD regions are simultaneously formed in the NMOS active island region and the PMOS active island region, respectively. Different NMOS active island regions could have n-LDD regions with different doping concentrations, and different PMOS active island regions could have p-LDD regions with different doping concentrations. Moreover, the doping concentrations of all first selective growth portion 217N1 in different NMOS devices are the same, the doping concentrations of all second selective growth portion 217N2 in different NMOS devices are the same as well. Such that, the process flow for forming the source region or the drain region of the NMOS transistors can reduce multiple selective epitaxy growth process steps and keep only one time to run selective epitaxy growth process step.

(4) Since there is no need to use ion-implantation to form LDD regions 221N so that there is no need to use thermal annealing process to reduce defects. Therefore, as no extra defects are generated once which were induced and hard to totally eliminate even by annealing process any unexpected leakage current sources should be significantly minimized, (5) Only (110)-oriented lattice structure must be handled along the channel-to-Source/Drain regions in contrast to that the conventional way of forming such conduction channels must handle a mixture of (110)-oriented and (100)-oriented lattice structures. So it is expected that newly grown silicon regions outgrowth from both transistors body and channel region with precisely controllable SEG should create better high quality/high-performance source/drain-to-channel conduction mechanism. The sub-threshold leakage should be reduced. The channel conduction performance should be enhanced since the conduction mechanism from channel-through LDD- to heavily-doped source/drain regions can thus have a holistic design even including some stressed-channel-mobility-enhancement technique by inserting foreign atoms/ions uniformly into source/drain regions could have synergistic effects for enhancing on-conduction performance.

(6) Another big advantage of the present disclosure is that since the vertical boundary between the edge **210*e* of gate region 210 and the edge of the newly grown silicon region (such as, the first selective growth portion 217N1 of the conductive region 217N) can be well defined based on thermal-oxidation controllability of the thermal oxide layer 215, the GIDL effect should be reduced in contrast to the conventional way of using LDD implantation to serve as the alignment of gate-edge to LDD; Since the thickness of the vertical portion of the thermal oxide layer is very accurately controlled based on the thermal oxidation process, the edge of the vertical thermal oxide layer could be controlled, and the edge of the thermal oxide vertical portion 215A of the thermal oxide layer 215 is just right underneath the outer spacer, rather than underneath the gate region. Thus, it is guaranteed that the gate dielectric layer 216 is unetched and remains it completeness during the etching of the thermal oxide vertical portion 215A for exposing the silicon surface 203*s* of the n-type LDD region 221N. Thus, the length of the gate region 210 could be shorter than the lateral distance between the thermal oxide vertical portion 215A of the thermal oxide layer 215 in the source trench and the other thermal oxide vertical portion 215A of the thermal oxide layer 215** in the drain trench.

(7) Since most the Source/Drain areas are isolated by insulation materials including the bottom structure of LISS, the junction leakage possibility can only happen to very small areas of the newly grown silicon region to channel regions and thus be significantly reduced.

(8) The portion of the composite spacer 211 (including portions of the SiN layer 211B and the oxide layer 211C) surrounding the active island regions 203N and 203P will be used as a reference or barrier for selective growth of source/drain regions, thus the selective growth of source/drain regions will not extend over the SiN layer (e.g., the extending dielectric layer) to contact with other selectively grown source/drain regions.

Of course, the present invention not only could be implemented in the planar MOSFET, but also be implemented in non-planar MOSFET, such as FinFET, Tri-gate, GAA (Gate-All-Around) transistors.

Figures 3A, 3B:
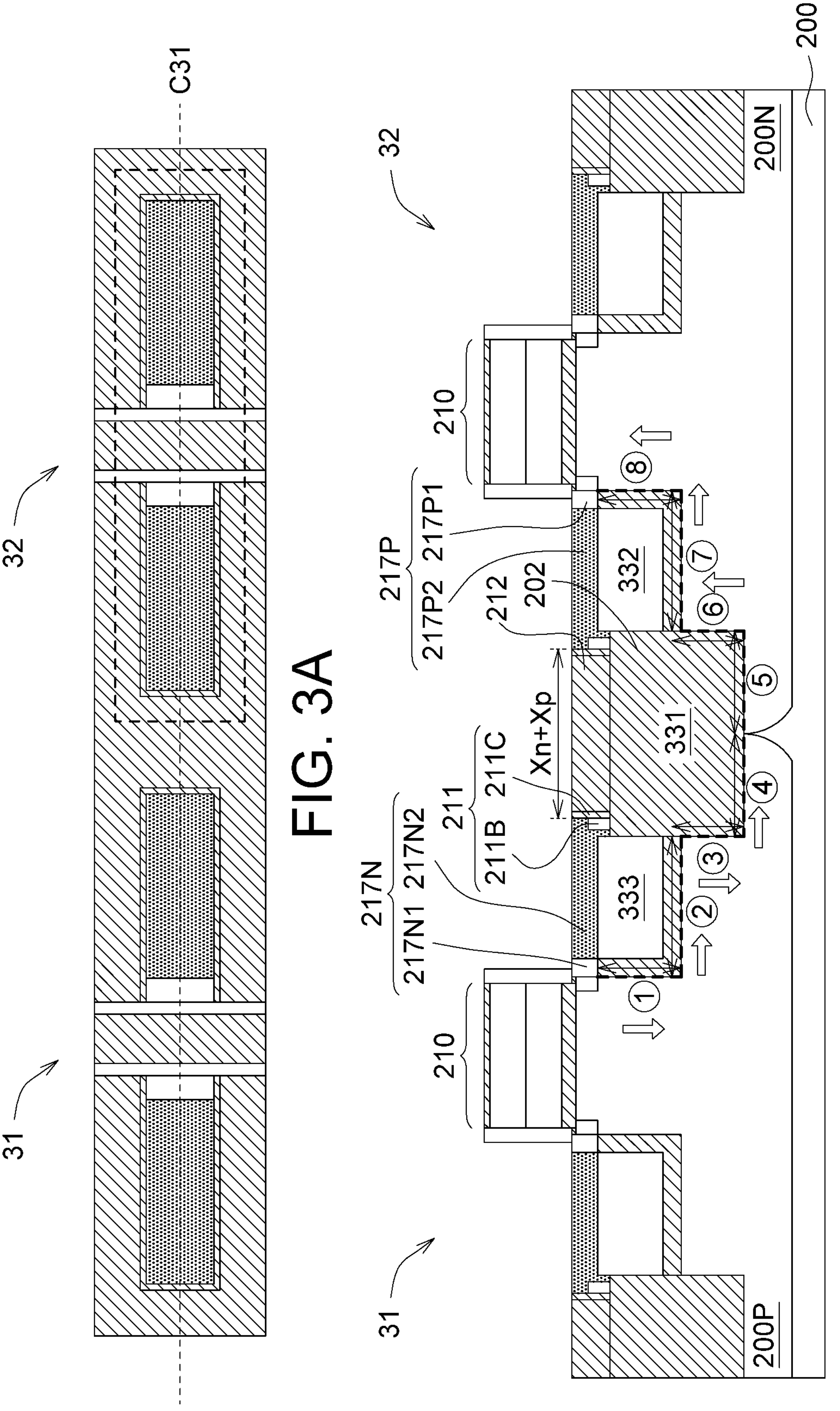
FIG. 3A is a top view illustrating a new transistor structure, according to another embodiment of the present disclosure.
FIG. 3B is a cross-sectional view of the transistor structure taken along the cutting line C31 as depicted in FIG. 3A and further showing a potential latch-up path of the transistor structure.

FIG. 3A is a top view illustrating a new transistor structure 30 according to another embodiment of the present disclosure. FIG. 3B is a cross-sectional view of the transistor structure 30 taken along the cutting line C31 as depicted in FIG. 3A and further showing a potential latch-up path of the transistor structure 30. The structure of the transistor structure 30 is similar to that of the transistor structure 20 as shown in FIGS. 2L(1) to FIG. 2L(3), except that the PMOS transistor 32 and NMOS transistor 31 as depicted in FIG. 3A (or FIG. 3B) are laterally positioned (arranged along the X axis) side-by-side, but the PMOS transistor 22 and NMOS transistor 21 in FIGS. 2L(1) to FIG. 2L(3) are vertically positioned (arranged along the Y axis) side-by-side. And the identical elements of these two embodiments are designated with the same reference numerals.

As shown in FIG. 3B, it could be simplified that there is a cross-shape of LISS 33 between the PMOS transistor 32 and NMOS transistor 31. The cross-shape LISS 33 includes a vertically extended isolation region 331 (which includes a first STI region 202 and a second STI region 212), a first horizontally extended isolation region 332 on the right hand side of the vertically extended isolation region 331, and a second horizontally extended isolation region 333 on the left hand side of the vertically extended isolation region 331.

The first and second horizontally extended isolation regions 332 and 333 are not underneath the gate structure 210 or the channel of the PMOS transistor 32 and NMOS transistor 31. The first horizontally extended isolation region 332 (right hand side of the vertically extended isolation region 331) contacts to a bottom side of the source/drain region of the PMOS transistor 32, and the second horizontally extended isolation region 333 (left hand side of the vertically extended isolation region 331) contacts to a bottom side of the source/drain region of the MMOS transistor 21. Therefore, the bottom sides of the source/drain regions in the PMOS transistor 32 and NMOS transistor 31 are shield from the silicon substrate 200. Moreover, the first or second horizontally extended isolation region 332 or 333 may be composite isolation which could include two or more different isolation materials (such as the oxide and the Nitride), or include two or more same isolation materials but each isolation material is formed by separate process.

As described before in the text and FIG. 1, a drawback of CMOS configuration/technology in contrast to pure-NMOS technology is that once a parasitic bipolar structure such as n+/p-sub/n-well/p+ junctions does exist and unfortunately some bad design cannot resist big current surges due to noises to trigger Latch-up to cause entire chip operation shutdown or permanent damages to chip functionality. But CMOS has several advantages over NMOS-only, especially on power reduction, the layout and process-rule for CMOS always need to very large space to separate n+ source/drain regions of NMOS from the p+ source/drain regions of PMOS, called as Latch-up Distance (FIG. 1) which consumes a lot of planar surfaces to inhibit any possibility of Latch-up. Moreover, if the source/drain n+/p and p+/n semiconductor junction area are too large, once the forward biasing accident is induced, the large surging current can be triggered to cause Latch-up. In addition, if the contact resistance between silicon source/drain and Metal-1 is large, it is also risky to trigger Latch-up.

The new invented transistor (CMOS) structure 30 as depicted in FIG. 3A and FIG. 3B results in a much longer path from the n+/p junction through the p-well (or p-substrate)/n-well junction to the n/p+ junction. As shown in FIG. 3B, according to the present invention, the possible Latch-up path from the LDD-n/p junction through the p-well/n-well junction to the n/LDD-p junction includes the length ①, the length ② (the length of the bottom wall of one LISS region), the length ③, the length ④, the length ⑤, the length ⑥, the length ⑦ (the length of the bottom wall of another LISS region), and the length ⑧ marked in FIG. 3B.

Figure 4:
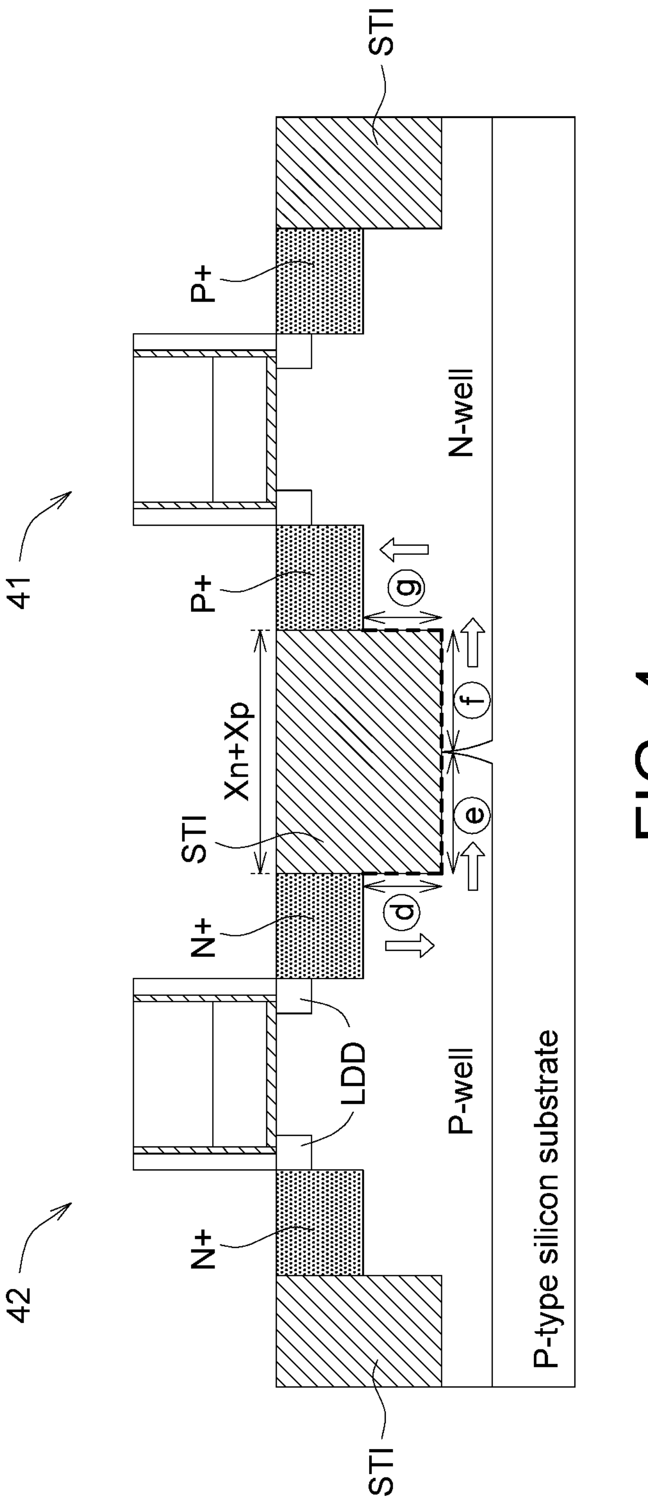
FIG. 4 is a cross-sectional view illustrating the potential latch-up path of another state-of-the-art CMOS device which includes a PMOS transistor and a NMOS transistor.

On the other hand, FIG. 4 is a cross-sectional view illustrating the potential latch-up path of another state-of-the-art CMOS device 40 which includes a PMOS transistor 42 and a NMOS transistor 41. In the traditional CMOS structure 40, the possible Latch-up path from the n+/p junction through the p-well/n-well junction to the n/p+ junction just includes the length d, the length e, the length f, and the length g. Such possible Latch-up path of FIG. 3B is longer than that in FIG. 4. Therefore, from device layout point of view, the reserved edge distance ($X_n+X_p$) between the PMOS transistor 32 and NMOS transistor 31 in FIG. 3B could be smaller than that in FIG. 4. Moreover, in FIG. 3B, the potential Latch-up path begins from LDD-n/p junction to the n/LDD-p junction, rather than n+/p junction to the n/p+ junction in FIG. 4.

Since the doping concentration in LDD-n or LDD-p region of FIG. 7C is lower than the doping concentration in n+ or p+ region of FIG. 4, the quantity of electrons or holes emitted from LDD-n or LDD-p region in FIG. 3B would be much lower than that emitted from n+ or p+ region in FIG. 4. Such lower emission of carriers will not only effectively decrease the possibility of induced Latch-up phenomenon, but also dramatically reduce the current even the Latch-up phenomenon is induced. Since both n+/p and p+/n junction areas are significantly reduced, even some abrupt forward-biasing of these junctions can reduce the abnormal current magnitude to deduct the chance of forming Latch-up in FIG. 3B. Moreover, better source/drain conductance improvement to Metal-1 contact (I×R or voltage drop) based on the composite source/drain region also reduces the possibility of forward-biasing the semiconductor junction so as to add higher immunity to Latch-up.

Referring to FIG. 3B again, according to the present invention, the composite source or drain region of the PMOS transistor 32 is surrounded by the first horizontally extended isolation region 322 and the vertically extended isolation region 331, only the LDD region of the composite source or drain region of the PMOS transistor 32 contacts to the silicon substrate 200 to form an LDD-p/n junction, rather than p+/n junction. Similarly, the composite source or drain region of the MMOS transistor 31 is surrounded by the second horizontally extended isolation region 333 and the vertically extended isolation region 331, and only the LDD region (the vertical length would be around 40 nm) of the composite source or drain region of the NMOS transistor 31 contacts to the silicon substrate to form an LDD-n/p junction, rather than p+/n junction. Therefore, the n+ regions of the NMOS transistor 31 and the p+ regions of the PMOS transistor 32 are both shielded from the substrate or well region. Moreover, since the first or second horizontally extended isolation region is composite isolation and thick enough, the parasitic Metal-Gated-Diode induced between the source (or drain) region and the silicon substrate could be minimized. Additionally, the Gate Induce Drain leakage (GIDL) effect could be improved as well. It is expected that the planar Latch-up distance reserved for neighboring NMOS and PMOS transistors 32 and 31 be significantly shortened such that the planar areas of the transistor (CMOS) structure 30 can be largely reduced.

To sum up, since active electrodes of source/drain regions are outgrown directly from crystalline planes of both transistor channel and body regions, their interfaces are formed seamless with the same (110) lattice orientation so that the device width covering the top horizontal edge and two vertical edges of the fin structure is precisely controlled to a maximized uniformity. Furthermore, there is no ion-implantation process which can only be formed from the top silicon downward into the source/drain regions and no thermal annealing process to fix the ion-implantation process which can make junction boundaries hard to be defined and controlled. The present invention can more precisely define the boundary edge of source/drain to the edge of the effective channel region and this boundary can be well aligned to the edge of Gate for minimizing SCE, GIDL and junction leakage currents.

Furthermore, the n+ and p+ regions are fully isolated by insulators in this newly invented transistor (CMOS) structure 30, and the proposed LISS would increase the isolation distance into silicon substrate to separate junctions in NMOS and PMOS transistors 31 and 32 so that the surface distance between junctions can be decreased.

Moreover, in the present invention the selective growth process could include various non-silicon dopants such as germanium or carbon atoms to increase stresses to enhance channel mobilities. Furthermore, metal plugs are proposed to complete the entire source/drain regions above the LISS. The doping concentration profile is controllable or adjustable in the horizontal SEG/ALD formation of source/drain regions according to the present invention.

Figure 5:
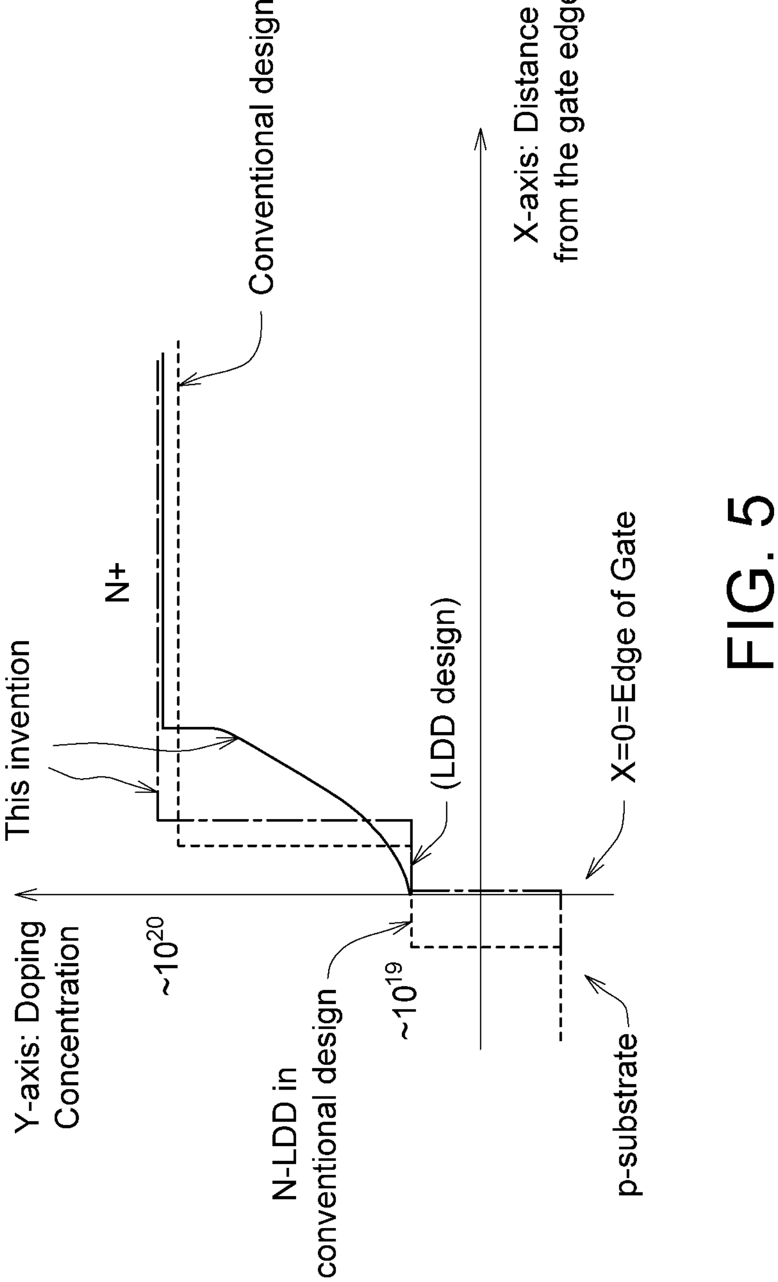
FIG. 5 is a diagram illustrating several doping concentration profiles of different drain regions based on cutting line C212 of FIG. 2L(1).

FIG. 5 shows several doping concentration profiles of different drain regions based on cutting line C212 of FIG. 2L(1), wherein the X-axis represents distance measured from the gate structure edge (or a predetermined edge approximate to the gate structure edge) of the MOSFET (i.e., the NMOS transistor 21), and the Y-axis represents doping concentration. In a conventional MOSFET structure, due to formation of n-LDD region by the ion implementation and thermal annealing, the n-LDD region will laterally penetrate into some region underneath the gate structure (dot line in FIG. 5), and the penetrating portion of the n-LDD region is unavoidable to shorten the effective channel length.

On the other hand, according to the present invention, due to formation of n-LDD region in-situ dope directly from the vertical surface of the transistor body, the location of the n-LDD region is easily controlled and will not penetrate underneath the gate structure (solid line or dash line in FIG. 5) and the effective channel length would not be shortened accordingly. Furthermore, the doping concentration profile in the drain region from edge of the gate structure would be gradually increased, for example, from $10^{19}/cm^3$ in n-LDD region to $10^{20}/cm^3$ in heavily doped region (gradually changed solid line in FIG. 5), or abruptly changed from $10^{19}/cm^3$ in n-LDD region to $10^{20}/cm^3$ in heavily doped region (abruptly changed dash line in FIG. 5). Similarly, so is for PMOS transistor 22 as well.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A transistor structure comprising:
- a semiconductor substrate with an original semiconductor surface;
- a gate region over the original semiconductor surface a first trench formed below the original semiconductor surface;
- a first isolation region in the first trench; and
- a first conductive region with a first doping region and a second doping region;
- wherein the first doping region is formed by thermally annealing a deposited in-situ doped semiconductor layer, and the second doping region is formed by selective growth based on the first doping region.

2. The transistor structure according to claim 1, wherein both the first doping region and the second doping region are not formed by ion implantation process.

3. The transistor structure according to claim 1, wherein the first conductive region is a lightly doped region.

4. The transistor structure according to claim 1, wherein the first doping region is formed within the semiconductor substrate and the second doping region is formed outside the semiconductor substrate.

5. The transistor structure according to claim 1, wherein the second doping region includes a highly doped region and a regularly doped region, and the first doping region includes a lightly doped region, a concentration of the highly doped region is greater than a concentration of the regularly doped region, and the concentration of the regularly doped region is greater than a concentration of the lightly doped region.

6. The transistor structure according to claim 1, wherein the first isolation region includes an L-shape oxide layer.

7. A transistor structure comprising:
- a semiconductor substrate with an original semiconductor surface;
- a first transistor comprising:
  - a first gate region over the original semiconductor surface;
  - a first trench formed below the original semiconductor surface;
  - a first isolation region in the first trench; and
  - a first conductive region with a first doping region and a second doping region;
- wherein the first doping region is within the semiconductor substrate and the second doping region is outside the semiconductor substrate; and
- a second transistor comprising:
  - a second gate region over the original semiconductor surface;
  - a second trench formed below the original semiconductor surface;
  - a second isolation region in the second trench; and
  - a second conductive region with a third doping region and a fourth doping region; wherein the third doping region is within the semiconductor substrate and the fourth doping region is outside the semiconductor substrate;
- wherein a doping concentration of the first doping region is different from that of third doping region; the first doping region is formed by thermally annealing a first deposited in-situ doped semiconductor layer; the third doping region is formed by thermally annealing a second deposited in-situ doped semiconductor layer; and a doping concentration of the first deposited in-situ doped semiconductor layer is different from a doping concentration of the second deposited in-situ doped semiconductor layer.

8. The transistor structure according to claim 7, wherein a doping concentration of the second doping region is the same or substantially the same as that of fourth doping region.

9. The transistor structure according to claim 7, wherein a threshold voltage of the first transistor is different from that of the second transistor.

10. The transistor structure according to claim 7, wherein both the first, second, third and fourth doping regions are not formed by ion implantation process.

11. A transistor structure comprising:
- a semiconductor substrate with an original semiconductor surface;

a first transistor comprising:

a first gate region over the original semiconductor surface;

a first trench formed below the original semiconductor surface;

a first isolation region in the first trench; and a first conductive region with a first doping region and a second doping region; and a second transistor comprising:

a second gate region over the original semiconductor surface;

a second trench formed below the original semiconductor surface;

a second isolation region in the second trench; and a second conductive region with a third doping region and a fourth doping region;

wherein the first doping region and third doping region are formed simultaneously by a thermal annealing process; and the first doping region is formed by thermally annealing a first deposited in-situ doped semiconductor layer, and the third doping region is formed by thermally annealing a second deposited in-situ doped semiconductor layer.

12. The transistor structure according to claim 11, wherein a doping concentration of the first doping region is different from a doping concentration of the third doping region.

13. The transistor structure according to claim 11, wherein a doping concentration of the second doped region is the same or substantially the same as a concentration of fourth doping region.

* * * * *